(12) United States Patent
Akino et al.

(10) Patent No.: US 9,976,078 B2
(45) Date of Patent: May 22, 2018

(54) POLYMER COMPOUND, LUMINESCENT MATERIAL, AND LIGHT EMITTING DEVICE

(71) Applicant: SUMITOMO CHEMICAL COMPANY, LIMITED, Tokyo, Japan (JP)

(72) Inventors: Nobuhiko Akino, Koshigaya (JP); Chizu Sekine, Tsukuba (JP); Satoshi Mikami, Tsukuba (JP); Tomoya Nakatani, Tsukuba (JP)

(73) Assignee: SUMITOMO CHEMICAL COMPANY, LIMITED, Chuo-ku, Tokyo (JP)

( * ) Notice: Subject to any disclaimer, the term of this patent is extended or adjusted under 35 U.S.C. 154(b) by 303 days.

(21) Appl. No.: 15/064,717

(22) Filed: Mar. 9, 2016

(65) Prior Publication Data

US 2016/0186051 A1    Jun. 30, 2016

Related U.S. Application Data

(62) Division of application No. 12/066,099, filed as application No. PCT/JP2006/318269 on Sep. 14, 2006, now Pat. No. 9,315,723.

(30) Foreign Application Priority Data

Sep. 14, 2005 (JP) .................... 2005-267210

(51) Int. Cl.
*H01L 51/50* (2006.01)
*C09K 11/02* (2006.01)
(Continued)

(52) U.S. Cl.
CPC ............ *C09K 11/025* (2013.01); *C08G 61/02* (2013.01); *C08G 61/10* (2013.01); *C08K 5/0041* (2013.01);
(Continued)

(58) Field of Classification Search
None
See application file for complete search history.

(56) References Cited

U.S. PATENT DOCUMENTS 5,923,119 A    7/1999  Hara et al.
6,372,154 B1   4/2002  Li
(Continued)

FOREIGN PATENT DOCUMENTS

GB    2 404 380 A    2/2005
JP    200250483 A    2/2002
(Continued)

OTHER PUBLICATIONS

Meier et al., Effective conjugation length and UV/vis spectra of oligomers.; Acta Polymer, vol. 48, pp. 379-384.*
(Continued)

*Primary Examiner* — Gregory D Clark
(74) *Attorney, Agent, or Firm* — Sughrue Mion, PLLC

(57) ABSTRACT

This invention provides a luminescent composition comprising a polymer and at least one phosphorescent compound, characterized in that the electronic conjunction chain coefficient $Z_e$ of the main repeating minimum unit of the polymer falls within the following range: $0 < Z_e \leq 2.00$ (1) wherein the electronic conjunction chain coefficient $Z_e$ is defined as a slope obtained by linear approximation of function $T_m = T_m (1/n_e)$ by the least square method wherein $n_e$ represents the number of conjugated electrons contained in repeating minimum units; and $T_m$ represents, for m-mer obtained by bonding repeating minimum units, the lowest triplet excitation energy in each m-mer when the number m is varied from 1 to 3 by one by one. Here in the number of conjugated electrons, only the conjugated electrons present in the main chain of the repeating minimum units are taken
(Continued)

into consideration, provided that, when there are a plurality of main repeating minimum units, the minimum $Z_e$ is used.

31 Claims, 1 Drawing Sheet

(51) Int. Cl.
    | | |
    |---|---|
    | C08G 61/02 | (2006.01) |
    | C08G 61/10 | (2006.01) |
    | C08K 5/00 | (2006.01) |
    | C08L 65/00 | (2006.01) |
    | C09K 11/06 | (2006.01) |
    | H01L 51/00 | (2006.01) |
    | C09D 5/22 | (2006.01) |

(52) U.S. Cl.
    CPC ............... *C08L 65/00* (2013.01); *C09D 5/22* (2013.01); *C09K 11/06* (2013.01); *H01L 51/0035* (2013.01); *H01L 51/0039* (2013.01); *H01L 51/0043* (2013.01); *H01L 51/0085* (2013.01); *C09K 2211/145* (2013.01); *C09K 2211/1416* (2013.01); *C09K 2211/1425* (2013.01); *C09K 2211/1441* (2013.01); *C09K 2211/1458* (2013.01); *C09K 2211/1466* (2013.01); *C09K 2211/185* (2013.01); *H01L 51/5016* (2013.01)

(56) References Cited

U.S. PATENT DOCUMENTS

| | | |
|---|---|---|
| 2002/0013451 A1 | 1/2002 | Huang et al. |
| 2002/0146589 A1 | 10/2002 | Akiyama et al. |
| 2003/0186080 A1 | 10/2003 | Kamatani et al. |
| 2004/0170863 A1 | 9/2004 | Kim et al. |
| 2005/0064235 A1 | 3/2005 | Liao et al. |
| 2005/0064241 A1 | 3/2005 | Kambe et al. |
| 2005/0123787 A1 | 6/2005 | Robello et al. |
| 2005/0238915 A1 | 10/2005 | Li et al. |
| 2005/0238917 A1 | 10/2005 | Yasuda et al. |
| 2005/0244674 A1 | 11/2005 | Yasuda et al. |
| 2006/0287498 A1 | 12/2006 | Morishita et al. |

FOREIGN PATENT DOCUMENTS

| | | |
|---|---|---|
| JP | 2002241455 A | 8/2002 |
| JP | 2003031368 A | 1/2003 |
| JP | 2003321403 | 11/2003 |
| TW | 560224 B | 11/2003 |
| WO | 2004113421 A1 | 12/2004 |
| WO | 2005059951 A2 | 6/2005 |

OTHER PUBLICATIONS

Yang et al., Theoretical studies on the electronic and optical properties of two thiophene-fluorene based pi-conjugated copolymers; Polymer, vol. 46, pp. 10970-10981.*
Office Action in European Application No. 12 153 506.6-1302 dated Feb. 19, 2016.
Office Action in European Application No. 12 153 506.6-1302 dated May 2, 2017.
Zhao et al., Alternating Copolymers of Cyclopenta[2,1-b;3,4-b']dithiophene and Thieno[3,4-c]pyrrole-4,6-dione for High-Performance Polymer Solar Cells, Advanced Functional Materials, 2011, vol. 21, No. 17, pp. 3331-3336.
Office Action dated Aug. 26, 2013 in corresponding Taiwanese Patent Application No. 095134037 with English translation.
Office Action dated Jul. 25, 2013 in corresponding Korean Patent Application No. 10-2008-7006162 with English translation.
Asanga B. Padmaperuma et al., "Photophysics of novel conjugated polymers with alternating heteroaromatic rings: synthesis and application", Proceedings of SPIE, vol. 5214, Feb. 16, 2004, pp. 318-327.
Chae Min Chun et al., "Tunable optical properties in polyfluorene copolymers by fluorine substitution", Polymer Preprints; 223rd ACS National Meeting, American Chemical Society, Orlando, FL, USA, pp. 81-82.
Communication dated Jan. 4, 2013, received from the European Patent Office in corresponding European Patent Application No. 12153506.6.
Communication dated Mar. 1, 2013, from the European Patent Office in corresponding European Patent Application No. 12153506.6.
D. Hertel et al., "Phosphorescence in Conjugated Poly(para-phenylene)-Derivatives," Adv. Mater., vol. 13, No. 1, Jan. 5, 2001, pp. 65-70 (XP-001001039).
Examination Report from the Intellectual Property Office, dated Dec. 26, 2012 from the Taiwan Patent Office, in corresponding Taiwan Patent Application No. 095134037, along with an English translation thereof.
Fang-Chung Chen et al., "High-performance polymer light-emitting diodes doped in a red phosphorescent iridium complex," Applied Physics Letters, vol. 80, No. 13, Apr. 1, 2002, pp. 2308-2310.
First Office Action dated Nov. 20, 2013 in corresponding Chinese Patent Application No. 201110414420.0 with English translation.
Klaerner, G., Polyfluorene Derivatives: Effective Conjugation Lengths from Well-Defined Oligomers, Macromolecules 1998, 3J, 2007-2009, pp. 2007-2009.
M. Rehahn et al., "Soluble poly(para-phenylene)s, $3^{a)}$ Variation of the length and the density of the solubilizing side chains," Makromolekulare Chemie, Macromolecular Chemistry and Physics, vol. 191, No. 9, Sep. 1, 1990, pp. 1991-2003 (XP 000170511).
Matthias Rehahn, et al., "Soluble poly(para-phenylene)s, 3a)—Variation of the length and the density of the solubilizing side chains", Makromol. Chem., vol. 191, 1990, pp. 1991-2003.
Notice of Preliminary Rejection dated Jan. 23, 2014 in corresponding Korean Patent Application No. 10-2008-7006162 with English translation.
Notice of Preliminary Rejection, dated Nov. 15, 2012 from the Korean Patent Office, in corresponding Korean Patent Application No. 10-2008-7006162, along with an English translation thereof.
Office Action dated Sep. 24, 2012 from the Japanese Patent Office in a counterpart Japanese Application No. 2006-247861.
Ralf Knapp, et al., Synthesis and material properties of soluble poly(1,1'-ferrocenylene-alt-p-oligophenylenes), Polymer, Elsevier Science Publishers B.V., GB, vol. 39, No. 23, Nov. 1, 1998, pp. 5827-5838.
Rejection Decision dated Aug. 25, 2011 from State Intellectual Property Office of People's Republic of China in corresponding Chinese Application No. 200680042434.1.
Second Office Action, dated Apr. 20, 2012, received from the Chinese Patent Office in counterpart Chinese Patent Application No. 200680042434.1, along with a partial English translation thereof.
State Intellectual Property Office of People's Republic of China, "The Second Office Action," issued in connection with Chinese Patent Application No. 201110414420.0, dated Apr. 25, 2014.
W. Zhu et al., "Synthesis of new iridium complexes and their electrophosphorescent properties in polymer light-emitting diodes," J. Mater. Chem., vol. 13, 2003, pp. 50-55 (XP-002548748).
Xiong Gong, et al., "Electrophosphorescence from a Conjugated Copolmer Doped with an Iridium Complex: High Brightness and Improved Operational Stability", Adv. Mater., vol. 15, No. 1, Jan. 3, 2003, pp. 45-49.
Yong-Young Noh, et al., "Singlet and Triplet Energy Transfer in Phosphorescent Dye Doped Polymer Light Emitting Devices", Materials Research Society Symposium Proceedings, Materials Research Society, Pittsburg, PA; vol. 708, Jan. 1, 2002, pp. 131-136.
Zhao Chen, et al., "Enhanced green electrophosphorescence by using polyfluorene host via interfacial energy transfer from polyvinylcarbazole", Organic Electronics, vol. 9, 2008, pp. 1002-1009.
Moses et al., Electrophosphorescence . . . Conjugatd Copolymer Doped, 2003, Advanced Materials, vol. 15, No. 1, pp. 45-49.

\* cited by examiner

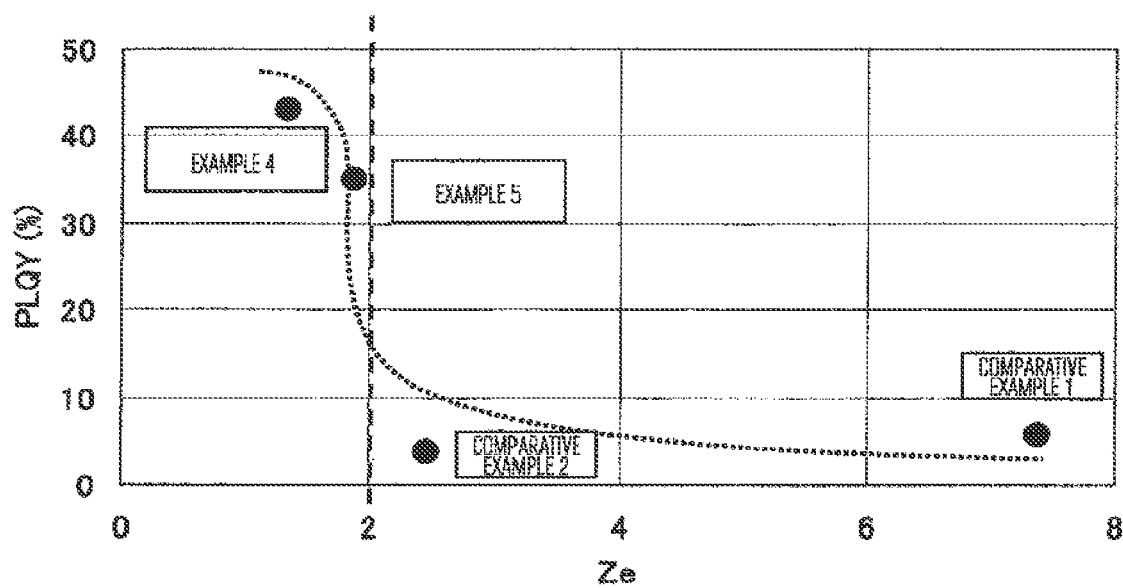

POLYMER COMPOUND, LUMINESCENT MATERIAL, AND LIGHT EMITTING DEVICE

CROSS-REFERENCE

This is a division of U.S. application Ser. No. 12/066,099, filed Jun. 9, 2008, which is a National Stage Entry of PCT/JP06/318269, filed Sep. 14, 2006, which claims priority from Japanese Patent Application No. 2005-267210, filed Sep. 14, 2005. The entire disclosures of the prior applications are incorporated herein by reference.

TECHNICAL FIELD

The present invention relates to a polymer compound, a luminescent material containing the polymer compound and a light-emitting device.

BACKGROUND ART

A device using a compound (hereinafter sometime referred to as a "phosphorescent compound"), which emits light from a triplet excited state, as a luminescent material for use in a light-emitting layer of a light-emitting device, is known to have high luminous efficiency. When the phosphorescent compound is used in a light-emitting layer, usually a matrix is added to the compound to form a composition, which is used as a luminescent material. As the matrix, a polymer such as a polyvinylcarbazole is known to be suitably used, since it can form a thin film by coating (see, for example, Patent Document 1).

DISCLOSURE OF THE INVENTION

Problem to be Solved by the Invention

However, such a device has a problem. It requires high drive voltage. On the other hand, when a conjugated polymer compound such as a polyfluorene is used as the matrix, low drive voltage can be realized. However, it is reported that such a conjugated polymer compound is not suitable for use as the matrix, since the lowest triplet excitation energy is generally low (see, for example, Patent Document 2). Indeed, for example, a luminescent material (Non-Patent Document 1) formed of a conjugated polymer compound such as a polyfluorene and a phosphorescent compound, shows as extremely low luminous efficiency. In general, such deterioration in performance is also known to appear more significantly as the wavelength of light emitted from the phosphorescent compound becomes shorter. In particular, a conjugated polymer compound suitable for a phosphorescent compound emitting light having a shorter wavelength than green has not yet been known. Accordingly, the object of the present invention is to provide a conjugated polymer that can be used in the matrix of a luminescent material containing a phosphorescent compound emitting light having a shorter wavelength than green and a luminescent material containing these compounds.

Patent Document 1: JP-A-2002-50483
Patent Document 2: JP-A-2002-241455
Non-Patent Document 1: APPLIED PHYSICS LETTERS, 80, 13, 2308 (2002)

Means for Solving the Problem

The present inventors conducted intensive studies. As a result, they found a significant correlation between a specific coefficient regarding the lowest triplet excitation energy of a polymer, especially, a coefficient (electron conjugated chain coefficient or conjugated chain coefficient), which represents degree of conjugation between repeat units of a polymer, and luminous performance. They further found that a luminescent material emitting light in a wide wavelength region including blue can be obtained by use of a polymer having such a coefficient within a predetermined range. Based on these findings, they have arrived at the present invention.

More specifically, the present invention comprises the followings:

1. A luminescent composition comprising a polymer and at least one type of phosphorescent compound, wherein electron conjugated chain coefficient $Z_e$ of a major and minimum repeat unit of the polymer falls within the following range:

$$0 < Z_e \leq 2.00 \quad (1)$$

where the electron conjugated chain coefficient $Z_e$ is defined as the slope of a linear approximation line of the following function in accordance with the least-squares method:

$$T_m = T_m(1/n_e)$$

where $n_e$ is the number of conjugated electrons contained in a minimum repeat unit; and $T_m$ is the lowest triplet excitation energy of an m-multimer obtained by connecting the minimum repeat units where m alters from 1 to 3 by 1's, with the proviso that the number of conjugated electrons is limited to that of conjugated electrons present in the main chain of the minimum repeat unit; and when a plurality of major and minimum repeat units are present, the lowest $Z_e$ is used.

2. The composition according to claim 1, said composition being a luminescent composition consisting of a polymer and at least one type of phosphorescent compound, wherein the electron conjugated chain coefficient $Z_e$ of the major and minimum repeat units of the polymer fall within the range (1).

3. The composition according to item 1 or 2, wherein, in the major and minimum repeat unit of the polymer, two or more single bonds capable of cleaving the main chain are not consecutively present on the main chain, in which the phase "capable of cleaving a main chain" refers to the ability of cleaving the main chain when the single bond is broken.

4. The composition according to any one of items 1 to 3, wherein the lowest triplet excitation energy $T_1$ of the polymer is 2.7 eV or more, in which the lowest triplet excitation energy $T_1$ of the polymer is an extrapolated value when $n_e$ is $\infty$, from a linear approximation line of the following function in accordance with the least-squares method $$T_m = T_m(1/n_e)$$

where $T_m$ is the lowest triplet excitation energy of an m-multimer obtained by connecting the minimum repeat units where m alters from 1 to 3 by 1's.

5. The composition according to any one of items 1 to 4, wherein the electron conjugated chain coefficient $Z_e$ of the major and minimum repeat unit of the polymer satisfies the condition:

$$0 < Z_e \leq 2.00$$

and the lowest triplet excitation energy $T_1$ of the polymer is 2.8 eV or more.

6. The composition according to any one of items 1 to 4, wherein the electron conjugated chain coefficient $Z_e$ of the major and minimum repeat unit of the polymer satisfies the condition:

$$0<Z_e\leq 2.00$$

and the lowest triplet excitation energy $T_1$ of the polymer is 2.9 eV or more.

7. The composition according to any one of items 1 to 4, wherein the electron conjugated chain coefficient $Z_e$ of the major and minimum repeat unit of the polymer satisfies the condition:

$$0<Z_e\leq 2.00$$

and the lowest triplet excitation energy $T_1$ of the polymer is 3.0 eV or more.

8. The composition according to any one of items 1 to 4, wherein the lowest triplet excitation energy $T_1$ (eV) of the polymer satisfies the condition:

$$2.7\leq T_1\leq 5.0.$$

9. The composition constituted of a polymer and a phosphorescent compound, according to item 8, wherein the polymer has a segment composed of a single type of basic structural unit; the lowest triplet excitation energy $T_{M1}$ of the basic structural unit satisfies the condition:

$$3.6\text{ eV}\leq T_{M1}\leq 5.5\text{ eV; and}$$

the lowest triplet excitation energy $T_1$ of the segment and the conjugated chain coefficient Z (defined below) of the basic structural unit, respectively, satisfy the conditions:

$$2.7\text{ eV}\leq T_1\leq 5.0\text{ eV and}$$

$$0.00<Z\leq 0.50$$

where the conjugated chain coefficient Z of the basic structural unit is defined as the slope of a linear approximation line of the following function in accordance with a least-squares method $$T_m=T_m(1/m)$$

where $T_m$ is the lowest triplet excitation energy of an m-multimer where m is the number of basic structural units and alters from 1 to 3 by 1's.

10. The composition according to item 9, wherein the number $n_e$ of conjugated electrons contained in the basic structural unit of the segment contained in a polymer constituting the composition satisfies the following condition:

$$n_e\leq 6.$$

11. The composition constituted of a polymer and a phosphorescent compound according to item 8, wherein the polymer has a segment composed of a single type of basic structural unit; the lowest triplet excitation energy $T_{M1}$ of the basic structural unit satisfies the condition:

$$3.2\text{ eV}\leq T_{M1}<3.6\text{ eV; and}$$

the lowest triplet excitation energy $T_1$ of the segment, the absolute value $E_{LUMO}$ of the lowest unoccupied molecular orbital energy and the conjugated chain coefficient Z of the basic structural unit, respectively, satisfy the conditions below:

$$2.7\text{ eV}\leq T_1\leq 5.0\text{ eV,}$$

$$1.4\text{ eV}<E_{LUMO}\leq 5.0\text{ eV and}$$

$$0.00<Z\leq 0.25.$$

12. The composition constituted of a polymer and a phosphorescent compound according to item 8, wherein the polymer has a segment composed of a single type of basic structural unit; the lowest triplet excitation energy $T_{M1}$ of the basic structural unit satisfies the condition:

$$2.9\text{ eV}\leq T_{M1}<3.2\text{ eV, and}$$

the lowest triplet excitation energy $T_1$ of the segment, the absolute value $E_{LUMO}$ of the lowest unoccupied molecular orbital energy and the conjugated chain coefficient Z of the basic structural unit, respectively, satisfy the conditions:

$$2.7\text{ eV}\leq T_1\leq 5.0\text{ eV,}$$

$$1.4\text{ eV}<E_{LUMO}\leq 5.0\text{ eV and}$$

$$0.00<Z\leq 0.13.$$

13. The composition constituted of a polymer and a phosphorescent compound according to item 8, wherein the polymer has a segment composed of at least two types of basic structural units; the lowest triplet excitation energy $T_1$ of the segment and the absolute value $E_{LUMO}$ of the lowest unoccupied molecular orbital energy, respectively, satisfy the conditions:

$$2.7\text{ eV}\leq T_1\leq 5.0\text{ eV and}$$

$$1.4\text{ eV}<E_{LUMO}\leq 5.0\text{ eV; and}$$

the conjugated chain coefficient Z (defined below) satisfies the condition:

$$0.00<Z\leq 0.40$$

where the conjugated chain coefficient Z is defined as the slope of a linear approximation line of the following function in accordance with a least-squares method $$T_m=T_m(1/m)$$

where $T_m$ is the lowest triplet excitation energy of an m-multimer where m is the number of minimum units and alters from 1 to 3 by 1's, in which the minimum unit is assumed to have the same basic structural unit constitution ratio as that constituting the segment.

14. A luminescent material containing a luminescent polymer which contains a luminescent compound in the same molecule, as a partial structure, wherein a polymer having an electron conjugated chain coefficient $Z_e$ of the major and minimum repeat unit falling within the range according to any one of items 1 to 8 is further contained, or the electron conjugated chain coefficient $Z_e$ of the luminescent polymer falls within the range according to any one of items 1 to 8.

15. The composition according to any one of items 1 to 14, wherein the minimum repeat unit of the polymer contains any one of an aromatic ring, a heterocyclic ring having 5 or more members and containing a hetero atom, an aromatic amine and a structure represented by the following formula (1), wherein, on the aromatic ring and the heterocyclic ring, a substituent may be present, which is selected from the group consisting of an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group and a cyano group.

(1)

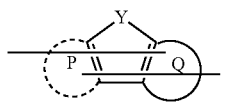

where P ring and Q ring each independently represent an aromatic ring; the P ring may or may not be present; two bonds are present respectively on the P ring and/or the Q ring when the P ring is present, and present on the 5-membered ring or 6-membered ring containing Y and/or the Q ring when the P ring is not present; furthermore, on the aromatic ring and/or the 5-membered ring or 6-membered ring containing Y, a substituent may be present, which is selected from the group consisting of an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group and a cyano group; Y represents —O—, —S—, —Se—, —B($R_1$)—, —Si($R_2$)($R_3$)—, —P($R_4$), —P$R_5$(=O)—, —C($R_6$)($R_7$)—, N($R_8$)—, —C($R_9$)($R_{10}$)—C($R_{11}$)($R_{12}$)—, O—C($R_{13}$)($R_{14}$)—, —S—C($R_{15}$)($R_{16}$)—, —N—C($R_{17}$)($R_{18}$)—, —Si($R_{19}$)($R_{20}$)—C($R_{21}$)($R_{22}$)—, —Si($R_{23}$)($R_{24}$)—Si($R_{25}$)($R_{26}$)—, —C($R_{27}$)=C($R_{28}$)—, —N=C($R_{29}$)— or —Si($R_{30}$)=C($R_{31}$)—; and $R_1$ to $R_{31}$ each independently represent a hydrogen atom, an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a silyloxy group, a substituted silyloxy group, a monovalent heterocyclic group or a halogen atom.

16. The composition according to item 15, wherein the minimum repeat unit of the polymer is constituted of an aromatic ring, a heterocyclic ring having 5 or more members and containing a hetero atom, an aromatic amine or a structure represented by the formula (1) mentioned above.

17. The composition according to any one of items 1 to 16, wherein the lowest triplet excitation energy ETT of a phosphorescent compound contained in the composition satisfies the condition:

$ETT > T_1 - 0.2$ (eV).

18. A luminescent composition containing a polymer and at least one type of phosphorescent compound, characterized in the major and minimum repeat unit of the polymer is represented by the formula (2) below:

(2)

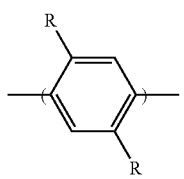

where R represents an alkyl group.

19. A luminescent composition containing a polymer and at least one type of phosphorescent compound, characterized in the major and minimum repeat unit of the polymer is represented by the formula (4) below:

(4)

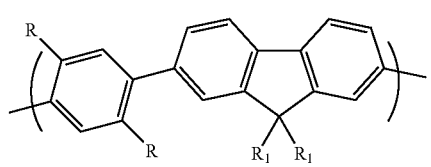

where R represents an alkyl group; and $R_1$ each independently represent a hydrogen atom, an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a silyloxy group, a substituted silyloxy group, a monovalent heterocyclic group or a halogen atom.

20. A luminescent composition containing a polymer and at least one type of phosphorescent compound, characterized in the major and minimum repeat unit of the polymer is represented by the formula (5) below:

(5)

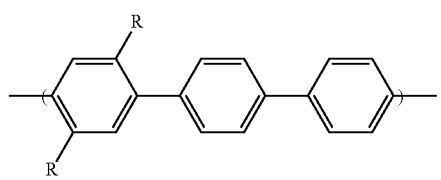

21. An ink composition characterized by containing the composition according to any one of items 1 to 20.

22. The ink composition according to item 21, having a viscosity of 1 to 100 mPa·s at 25° C.

23. A luminous thin film characterized by containing the composition according to any one of items 1 to 20.

24. An organic semiconductor thin film characterized by containing the composition according to any one of items 1 to 20.

25. An opt-electric device characterized by containing the composition according to any one of items 1 to 20.

26. An opt-electric device characterized by containing a layer containing the composition according to any one of items 1 to 20 between the electrodes consisting of an anode and a cathode.

27. The opt-electric device according to item 26, characterized by further comprising a charge transport layer or a charge blocking layer between the electrodes consisting of an anode and a cathode.

28. The opt-electric device according to items 25 to 27, wherein the opt-electric device is a light-emitting device.

29. A planar light source characterized by using the light-emitting device according to item 28.

30. A segment display device characterized by using the light-emitting device according to item 28.

31. A dot matrix display device characterized by using the light-emitting device according to item 28.

32. A liquid crystal display device characterized by using the light-emitting device according to item 28 as backlight.

33. Illumination characterized by using the light-emitting device according to item 28.

The conjugated electron used in the present invention is limited to the electron generally called as a π conjugated electron in the field of organic chemistry and thus "lone" electron is not included in the present invention. More specifically, by way of example, pyrrole and thiophene and furan structures each have 4 conjugated electrons. Benzene and pyridine structures each have 6 conjugated electrons. Naphthalene, anthracene, tetracene and pentacene structures have 10, 14, 18 and 22 conjugated electrons, respectively. Fluorene and carbazole structures each have 12 conjugated electrons. A triphenylamine structure has 18 conjugated electrons.

It is preferable that the electron conjugated chain coefficient $Z_e$ preferably satisfies the condition: $0<Z_e\leq 2.00$. It is more preferable that the electron conjugated chain coefficient $Z_e$ satisfies the condition: $0<Z_e\leq 2.00$ and the lowest triplet excitation energy $T_1$ (hereinafter also referred to as "$T_1$ energy") of the polymer is 2.8 eV or more. It is further preferable that $0<Z_e\leq 2.00$ and $T_1$ is 2.9 eV or more, and particularly preferable that $0<Z_e\leq 2.00$ and $T_1$ is 3.0 eV or more.

As the lowest triplet excitation energy $T_1$ of a polymer, use is made of an extrapolated value when $n_e=\infty$, from a linear approximation line of the following function in accordance with a least-squares method $$T_m = T_m(1/n_e)$$

where $T_m$ is the lowest triplet excitation energy of an m-multimer obtained by connecting the minimum repeat units where m alters from 1 to 3 by 1's.

The major and minimum repeat unit of the present invention will be explained. The major and minimum repeat unit refers to one type of repeat unit having the largest weight fraction of all types of repeat units found in a polymer and having the smallest mass of the same type repeat units of the same weight fraction. The weight fraction is not particularly limited; however, the weight fraction is preferably 50% or more, more preferably 70% or more, further preferably 80% or more, and particularly preferably 90% or more. The major and minimum repeat unit can be generally found by analyzing the structure of a polymer in detail. In a polymer synthesized by a specific method, the structure of the polymer can be generally determined by common knowledge on the structure of a monomer and the method of synthesis.

According to the present invention, there is further provided a composition constituted of a polymer and a phosphorescent compound, according to item 8, wherein the polymer has a segment composed of a single type of basic structural unit; the lowest triplet excitation energy $T_{M1}$ of the basic structural unit satisfies the condition:

3.6 eV$\leq T_{M1}$5.5 eV; and the lowest triplet excitation energy $T_1$ of the segment and the conjugated chain coefficient Z of the basic structural unit defined below respectively satisfy the conditions:

2.7 eV$\leq T_{M1}$5.0 eV $0.00<Z\leq 0.50$ where the conjugated chain coefficient Z of the basic structural unit is defined as the slope of a linear approximation line of the following function in accordance with a least-squares method $$T_m = T_m(1/m)$$

where $T_m$ is the lowest triplet excitation energy of an m-multimer where m is the number of basic structural units and alters from 1 to 3 by 1's.

The number $n_e$ of conjugated electrons contained in the basic structural unit of the segment contained in the polymer preferably satisfies the following condition:

$n_e \leq 6$.

It is preferable that the lowest triplet excitation energy $T_{M1}$ of the basic structural unit satisfies the condition:

3.2 eV$\leq T_{M1}<3.6$ eV.

the lowest triplet excitation energy $T_1$ of the segment, the absolute value $E_{LUMO}$ of the lowest unoccupied molecular orbital energy and the conjugated chain coefficient Z (defined below) of the basic structural unit respectively satisfy the conditions:

2.7 eV$\leq T_1\leq 5.0$ eV 1.4 eV$<E_{LUMO}\leq 5.0$ eV $0.00<Z\leq 0.25$.

It is further preferable that the lowest triplet excitation energy $T_{M1}$ of the basic structural unit satisfies the condition:

2.9 eV$\leq T_{M1}<3.2$ eV, the lowest triplet excitation energy $T_1$ of the segment, the absolute value $E_{LUMO}$ of the lowest unoccupied molecular orbital energy and the conjugated chain coefficient Z (defined below) of the basic structural unit respectively satisfy the conditions.

2.7 eV$\leq T_1\leq 5.0$ eV 1.4 eV$<E_{LUMO}\leq 5.0$ eV.

$0.00<Z\leq 0.13$.

According to the present invention, there is provided a composition constituted of a polymer and a phosphorescent compound, wherein the polymer has a segment composed of at least two types of basic structural units; the lowest triplet excitation energy $T_1$ of the segment and the absolute value $E_{LUMO}$ of the lowest unoccupied molecular orbital energy respectively satisfy the conditions:

2.7 eV$\leq T_1\leq 5.0$ eV 1.4 eV$<E_{LUMO}\leq 5.0$ eV; and the conjugated chain coefficient Z (defined below) satisfies the condition:

$0.00<Z\leq 0.40$ where the conjugated chain coefficient Z is defined as the slope of a linear approximation line of the following function in accordance with a least-squares method $$T_m = T_m(1/m)$$

where, $T_m$ is the lowest triplet excitation energy of an m-multimer where m is the number of minimum units and alters from 1 to 3 by 1's, in which the minimum unit is assumed to have the same basic structural unit constitution ratio as that constituting the segment.

The basic structural unit constituting a segment contained in a polymer according to the present invention can be specified as follows:

For example, the case of a segment having an arylene group and/or a divalent heterocyclic ring in the main chain will be described. The arylene used herein may have a benzene ring and a condensed ring and include two independent benzene rings or condensed rings which are joined to each other directly or by annulation, as is the case of fluorene. The divalent heterocyclic ring refers to the remaining atomic group obtained by subtracting two hydrogen atoms from a heterocyclic compound. The heterocyclic compound used herein refers to an organic compound having a ring structure constituted of carbon atoms and a hetero atom such as oxygen, sulfur, nitrogen, phosphorus and boron.

1) When a single bond is present for directly joining an arylene groups and/or divalent heterocyclic rings present in the main chain of a segment, the segment is cleaved at all single bonds. The portions thus obtained are called "structural units".

2) Of the structural units, a structural unit containing none of the groups represented by —X— [—X-represents a divalent hetero atom (—O—, —S—), —(CO)—, —CR=CR— or —C≡C—, where R represents a substituent] is defined as a basic structural unit.

3) Of the structural units, a structural unit containing a group represented by —X— as mentioned above in the main chain is cleaved at either one of the two bonds of —X— to produce a structural unit (split unit structure), which is used as a basic structural unit. In this case, the bond to be cleaved should be selected so as to reduce the number of types of split unit structures to a minimum.

If not, the structural unit mentioned above is defined as the basic structural unit.

This will be more specifically described by way of examples.

Ex. 1

When a segment is represented by the formula:

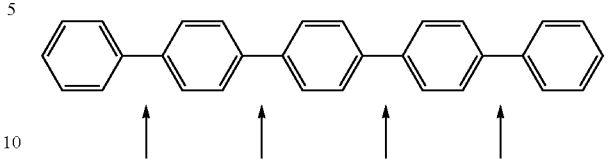

where symbol ↓ indicates a cleavage site (the same definition will be used hereinafter), the structural unit is benzene. Since benzene does not contain a group represented by —X— in the main chain, benzene is used as the basic structural unit.

Ex. 2

When a segment is represented by the formula:

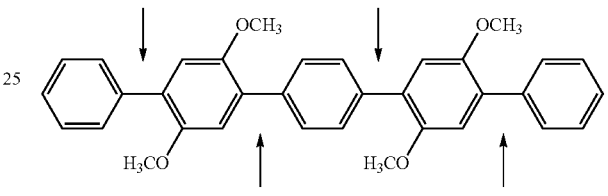

where symbol ↓ indicates a cleavage site (the same definition will be used hereinafter), the structural unit is benzene and 1,4-methoxy-benzene. Since benzene and 1,4-methoxy-benzene do not contain a group represented by —X— in the main chain, benzene and 1,4-methoxy-benzene are used as the basic structural unit.

Ex. 3

When a segment is represented by the formula:

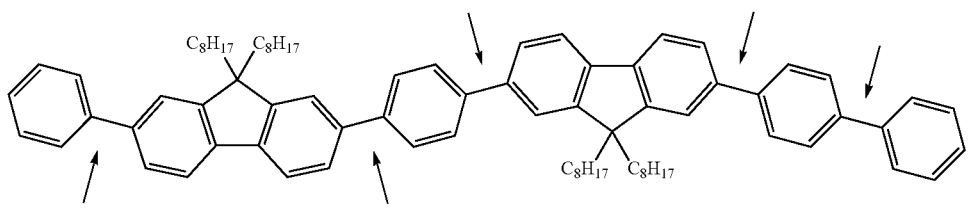

the structural unit is 9,9'-dioctyl-fluorene and benzene. Since these do not contain a group represented by —X—, 9,9'-dioctyl-fluorene and benzene are used as the basic structural unit.

Ex. 4

When a segment is represented by the formula:

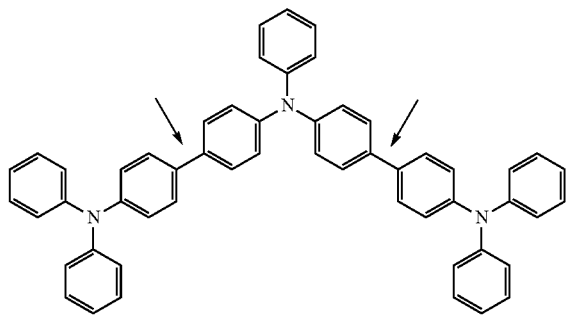 [SMILES: c1ccc(N(c2ccccc2)c2ccc(-c3ccc(N(c4ccccc4)c4ccc(-c5ccc(N(c6ccccc6)c6ccccc6)cc5)cc4)cc3)cc2)cc1]

the structural unit is represented by

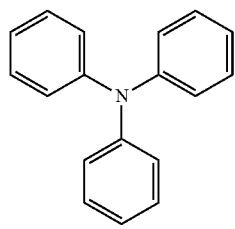

Since the structural unit does not contain the aforementioned group represented by —X—, the basic structural unit is identical to the structural unit.

Ex. 5

When a segment is represented by

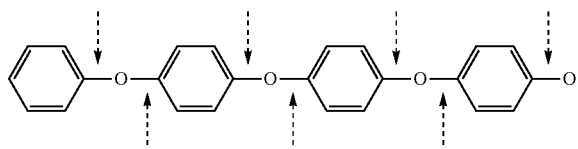

where the dot-line arrow above represents a cleavable site, the structural unit is identical to the aforementioned segment.

Since the main chain contains —O— belonging to the aforementioned group represented by —X—, cleavage is made either one of the two bonds of —O—. When the main chain is cleaved at the site indicated by an up-pointing dot-line arrow (or down-pointed dot-line arrow), the resultant structures are all represented by

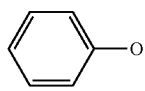

and serve as split structural units. Since the number of types of split structural units is the lowest, the split structural unit is used as a basic structural unit.

Ex. 6

When a segment is represented by

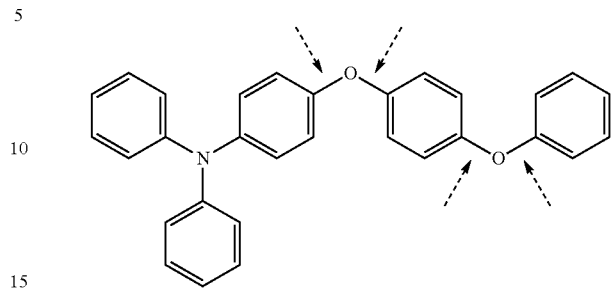

the structural unit is identical to the segment mentioned above.

Since —O— belonging to a group represented by —X— is contained in the main chain, a cleavage site is selected so as to reduce the number of types of split units to a minimum. As a result, the following two types of basic structural units are obtained.

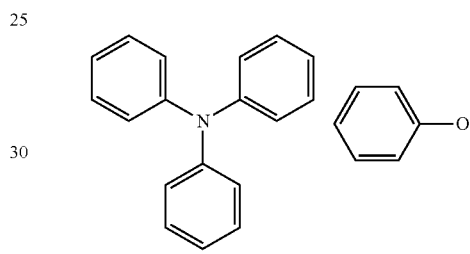

Advantages of the Invention

A luminescent composition according to the present invention can emit light having a wavelength of green to blue. Accordingly, when a luminescent material containing a polymer compound according to the present invention is applied to an opt-electric device such as an electroluminescent device, the characteristics of the resultant device can be more improved.

BRIEF DESCRIPTION OF THE DRAWING

FIG. 1 is a graph showing the correlation between electron conjugated chain coefficient $Z_e$ and PL (photoluminescence) quantum efficiency (PLQY) (%) of Examples and Comparative Examples of the present invention.

BEST MODE FOR CARRYING OUT THE INVENTION

The present invention will now be described in detail below.

The lowest triplet excitation energy and the lowest unoccupied molecular orbital energy may be actually measured; however, in the present invention, it will be determined by a computational scientific technique. As examples of the computational scientific technique, a semi-empirical technique and a non-empirical technique such as a molecular orbital method and a density functional method are known.

For example, to obtain an optimized structure and excitation energy, Hartree-Fock (HF) method or a density functional method may be used.

In the present invention, a quantum chemical calculation program such as Gaussian98 or Gaussian03 was used in accordance with the HF method to optimize the structure of the minimum repeat unit, basic structural unit constituting a segment or minimum unit satisfying the ratio of individual basic structural units. More specifically, the structure of an m-multimer of the minimum repeat unit, basic structural unit or minimum unit was optimized, where m represents the number of minimum repeat units, basic structural units or minimum units and represents an integer from 1 to 3. At this time, as the basis function, 6–31G* was used. Furthermore, the lowest unoccupied molecular orbital energy and lowest triplet excitation energy of an m-multimer were obtained, after optimization of the structure, by a time-dependent density functional method of the B3P86-level using the same basis as above.

When the repeat unit of a (conjugated) polymer contains a long side chain, the portion of the long side chain containing a chemical structure to be calculated can be simplified into a shorter side chain, which is subjected to calculation (for example, when an octyl group is contained as a side chain, the side chain not present next to the connecting site is regarded as a methyl group and the side chain present next to the connecting site is regarded as a propyl group and then calculation is made. When an octyloxy group is contained as a side chain, the octyloxy group is regarded as a methoxy group and then calculation is made).

As the lowest triplet excitation energy ($T_n$) of a segment consisting of an n-number of minimum repeat units or an n-number of mono type of basic structural units, in other words, a segment consisting of mono-type minimum repeat units or basic structural units, use is made of an extrapolated value at $1/(n_e)$ from least squares linear approximation of the function:

$$T_m = T_m(1/(n_e))$$

where m is the number of minimum repeat units or basic structural units; $T_m$ is $T_1$ energy of an m-multimer; $n_e$ is the number of conjugated electrons contained in an m-multimer.

The electron conjugated chain coefficient $Z_e$ is defined as the slope of the linear approximation line. Furthermore, the lowest unoccupied molecular orbital energy of a segment consisting of an m-number of minimum repeat units or an m-number of basic structural units connected to each other can be obtained in the same approach. In particular, the value of the lowest triplet excitation energy and the absolute value of the lowest unoccupied molecular orbital energy at $(1/n_e) = 0$ correspond to those at $n_e = \infty$ and gives the lowermost value whenever $n_e$ takes any value. When linear approximation is performed in accordance with the least squares method or when the electron conjugated chain coefficient $Z_e$ is defined, the value m is an integer from 1 to 3 in the present invention.

The conjugated chain coefficient Z is obtained as follows. As the lowest triplet excitation energy ($T_n$) of a segment consisting of an n number of mono type basic structural units, i.e., a segment consisting of basic structural units of the same type, use is made of an extrapolated value at (1/n) from least-squares linear approximation of the function of 1/m:

$$T_m = T_m(1/m)$$

where m is the number of the basic structural units, $T_m$ is $T_1$ energy of an m-multimer of the basic structural unit.

The conjugated chain coefficient Z is defined as the slope of the linear approximation line. Furthermore, the lowest unoccupied molecular orbital energy of a segment consisting of an n-number of basic structural units connected to each other can be obtained in the same approach. In particular, the value of the lowest triplet excitation energy and the absolute value of the lowest unoccupied molecular orbital energy at $(1/n) = 0$ correspond to those at $n = \infty$ and give the lowermost value whenever n takes any value. When linear approximation is performed by the least squares method or when the conjugated chain coefficient Z is defined, the value m is an integer from 1 to 3 in the present invention.

When a segment consists of single type basic structural units, the electron conjugated chain coefficient $Z_e$ and the conjugated chain coefficient Z can be converted in accordance with the following equation:

$$Z_e = n_e Z$$

where $n_e$ is the number of conjugated electrons contained in a basic structural unit.

When a segment consists of at least two types of basic structural units, the constitution ratio of individual types of basic structural units can be obtained. Assuming that a minimum unit has the same structural unit as a basic structural unit (in other words, a minimum unit satisfying a constitution ratio of individual types of basic structural units) and the number of minimum units present in the segment is represented by m, the segment can be considered as an m-multimer of the "minimum units". Therefore, when a segment consists of at least two types of basic structural units, assuming that the number of minimum units satisfying the constitution ratio of individual types of basic structural units constituting the segment is represented by m, $T_1$ energy ($T_m$) of an m-multimer of the minimum unit can be expressed by a function of 1/m:

$$T_m = T_m(1/m)$$

As $T_1$ energy ($T_n$) of an n-multimer of a minimum unit, use can be made of an extrapolated value at (1/n) from least-squares linear approximation of the function. The conjugated chain coefficient Z is defined as the slope of the linear approximation line. Furthermore, the lowest unoccupied molecular orbital energy of the segment, which is an n-multimer of a minimum unit, can be obtained in the same approach. When linear approximation is performed in accordance with the least squares method or when the conjugated chain coefficient Z is defined, the value m is an integer from 1 to 3 in the present invention.

The polymer contained in a composition according to the present invention may contain a phosphorescent compound in the same molecule as a partial structure.

When the polymer contained in a composition according to the present invention contains a phosphorescent compound in the same molecule as a partial structure, examples of a polymer containing a polymer (A) structure and a phosphorescent compound (B) structure in the same molecule include a polymer having a luminescent compound (B) structure in the main chain of the polymer (A);

a polymer having a luminescent compound (B) structure in an end of the polymer (A); and a polymer having a luminescent compound (B) structure in the side chain of the polymer (A).

As the phosphorescent compound, a compound emitting light from the triplet excited state can be used.

As the compound having a metal complex structure emitting light from the triplet excited state, mention may be made of conventional low-molecular weight electroluminescent materials, which are disclosed in Nature, (1998), 395, 151; Appl. Phys. Lett. (1999), 75(1), 4; Proc. SPIE-Int. Soc.

Opt. Eng. (2001), 4105 (Organic Light-Emitting Materials and Devices IV), 119; J. Am. Chem. Soc., (2001), 123, 4304; Appl. Phys. Lett., (1997), 71(18), 2596; Syn. Met., (1998), 94(1), 103; Syn. Met., (1999), 99(2), 1361; Adv. Mater., (1999), 11(10), 852, Inorg. Chem., (2003), 42, 8609; Inorg. Chem., (2004), 43, 6513; Journal of the SID 11/1, 161 (2003); WO2002/066552; WO2004/020504; and WO2004/020448. Of them, the ratio of the sum of the squares of the orbital coefficients of the outermost d orbitals of the central metal relative to the sum of the squares of all atomic orbital coefficients in the highest occupied molecular orbital (HOMO) is preferably ⅓ or more to obtain high efficiency. For example, a transition metal having a central metal belonging to the 6th period such as an ortho-metallated complex may be mentioned.

As a central metal of the complex emitting light from the triplet excited state, generally use is made of an atom of an atomic number of 50 or more. This is a metal having a spin-orbit interaction with the complex and likely causing intersystem-crossing between the singlet state and the triplet state. Preferable examples thereof include gold, platinum, iridium, osmium, rhenium, tungsten, europium, terbium, thulium, dysprosium, samarium, praseodymium, gadolinium and yttrium atom. More preferable examples thereof include gold, platinum, iridium, osmium, rhenium and tungsten atoms. Further preferable examples include gold, platinum, iridium, osmium and rhenium atoms. The most preferably examples thereof include gold, platinum, iridium and rhenium.

As a ligand of the complex emitting light from the triplet excited state, mention may be made of e.g., 8-quinolinole and a derivative thereof, benzo-quinolinol and a derivative thereof, and 2-phenyl-pyridine and a derivative thereof.

In view of the luminescent efficiency, the lowest triplet excitation energy ETT of a compound (phosphorescent compound) emitting light from the triplet excited state preferably satisfies the following condition:

$ETT > T_1 - 0.2$ (eV)

The amount of a luminescent material (phosphorescent compound) emitting light from the triplet excited state in a composition according to the present invention varies depending upon the type of a polymer to be used in combination and the properties to be optimized and therefore is not particularly limited. However, the amount of the luminescent material is generally 0.01 to 80 parts by weight, preferably 0.1 to 60 parts by weight, more preferably, 0.1 to 30 parts by weight, further preferably 0.1 to 10 parts by weight, and particularly preferably, 0.1 to 5 parts by weight based on the total amount of the composition (100 parts by weight). Two or more types of metal complexes may be contained.

The polymer contained in a composition according to the present invention is not particularly limited as long as the electron conjugated chain coefficient $Z_e$ or the conjugated chain coefficient Z of the polymer satisfies a specific relationship. However, a conjugated polymer is preferably used, in which two or more single bonds capable of cleaving the main chain are not present next to each other on the main chain in major and minimum repeat unit. The term "capable of cleaving the main chain" refers to the phenomenon where the main chain composed of minimum repeat units is cleaved and disconnected by cutting the single chain.

More specifically, examples thereof preferably include a polymer having arylene or a divalent heterocyclic ring in the main chain, and more preferably, a polymer having any one of an aromatic ring, a heterocyclic ring that has 5 or more members and contains a hetero atom, an aromatic amine and a structure represented by the formula (1) below.

On the aromatic ring compound, heterocyclic ring compound or aromatic amine compound herein, a substituent may be present, which is selected from the group consisting of an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imide group, monovalent heterocyclic group, carboxyl group, substituted carboxyl group and cyano group.

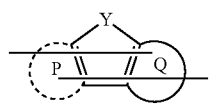

Formula (1)

In the formula, P ring and Q ring each independently represent an aromatic ring; the P ring may or may not be present; two bonds are present respectively on the P ring and/or the Q ring when the P ring is present, and present on the 5-membered ring or 6-membered ring each containing Y and/or the Q ring when the P ring is not present; furthermore, on the aromatic ring and/or the 5-membered ring or 6-membered ring containing Y, a substituent may be present, which is selected from the group consisting of an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imide group, monovalent heterocyclic group, carboxyl group, substituted carboxyl group and cyano group; and Y represents —O—, —S—, —Se—, —B($R_1$)—, —Si($R_2$)($R_3$)—, —P($R_4$)—, —PR$_5$(=O)—, —C($R_6$)($R_7$)—, —N($R_8$)—, —C($R_9$)($R_{10}$)—C($R_{11}$)($R_{12}$)—, —O—C($R_{13}$)($R_{14}$)—, —S—C($R_{15}$)($R_{16}$)—, —N—C($R_{17}$)($R_{18}$)—, —Si($R_{19}$)($R_{20}$)—C($R_{21}$)($R_{22}$)—, —Si($R_{23}$)($R_{24}$)—Si($R_{25}$)($R_{26}$)—, —C($R_{27}$)=C($R_{28}$)—, —N=C($R_{29}$)— or —Si($R_{30}$)=C($R_{31}$)—; and $R_1$ to $R_{31}$ each independently represent a hydrogen atom, an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, silyloxy group, substituted silyloxy group, monovalent heterocyclic group or halogen atom. Of them, an alkyl group, alkoxy group, alkylthio group, aryl group, aryloxy group, arylthio group, arylalkyl group, arylalkoxy group, or monovalent heterocyclic group is preferable; an alkyl group, alkoxy group, aryl group or monovalent heterocyclic group is more preferable; and an alkyl group or aryl group is particularly preferable.

As the aromatic amine, mention may be made of an aromatic amine having a structure represented by the formula below:

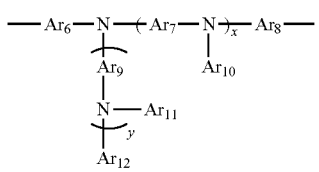

where $Ar_6$, $Ar_7$, $Ar_8$ and $Ar_9$ each independently represent an arylene group or a divalent heterocyclic group; $Ar_{10}$, $Ar_{11}$ and $Ar_{12}$ each independently represent an arylene group or a monovalent heterocyclic group; $Ar_6$, $Ar_7$, $Ar_8$, $Ar_9$ and $Ar_{10}$ may have a substituent; x and y each independently represent 0 or 1; and $0 \leq x+y \leq 1$.

Examples of the structure represented by the formula (1) above include structures represented by the formula (1-1), (1-2) or (1-3) below:

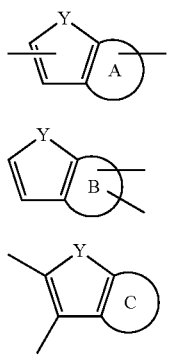

where ring A, ring B and ring C each independently represent an aromatic ring. The formula (1-1), (1-2) and (1-3) may have a substituent selected from the group consisting of an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imide group, monovalent heterocyclic group, carboxyl group, substituted carboxyl group and cyano group. Y means the same as mentioned above; and structures represented by the formula (1-4) or (1-5) below

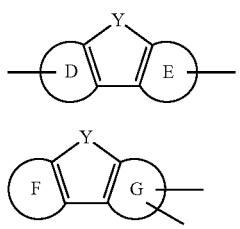

where ring D, ring E, ring F and ring G each independently represent an aromatic ring that may have a substituent selected from the group consisting of an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imide group, monovalent heterocyclic group, carboxyl group, substituted carboxyl group and cyano group. Y means the same as mentioned above.

In the formula (1-4) or (1-5), Y is preferably a C atom, N atom, O atom or S atom in order to obtain a high luminous efficiency.

In the formulas (1-1), (1-2), (1-3), (1-4) and (1-5), ring A, ring B, ring C, ring D, ring E, ring F and ring G each independently represent an aromatic ring. Examples of the aromatic ring include aromatic hydrocarbon rings such as a benzene ring, naphthalene ring, anthracene ring, tetracene ring, pentacene ring, pyrene ring and phenanthrene ring; and heteroaromatic rings such as a pyridine ring, bipyridine ring, phenanthroline ring, quinoline ring, isoquinoline ring, thiophene ring, furan ring and pyrrole ring.

A polymer contained in a composition according to the present invention is not particularly limited as long as the electron conjugated chain coefficient $Z_e$ or a conjugated chain coefficient Z of the polymer satisfies the aforementioned condition. Such a polymer preferably has a structure whose minimum repeat unit contains an aromatic ring, a heterocyclic ring having 5 or more members and containing a hetero atom, an aromatic amine or any one of structures selected from those represented by the aforementioned formula (1). Specific examples thereof include, but not limited to, the followings. In the formulas (3-1) to (3-13), R represents a substituent, R1 represents a hydrogen atom or a substituent. Examples of substituents of R and R1 include a halogen atom, an alkyl group, alkyloxy group, alkylthio group, aryl group, aryloxy group, arylthio group, arylalkyl group, arylalkyloxy group, arylalkylthio group, acyl group, acyloxy group, amide group, acid imide group, imine residue, substituted amino group, substituted silyl group, substituted silyloxy group, substituted silylthio group, substituted silylamino group, a monovalent heterocyclic group, heteroaryloxy group, heteroarylthio group, arylalkenyl group, arylethynyl group, substituted carboxyl group and cyano group. A plurality of R and R1 may be the same or different. As R, an alkyl group, aryl group, arylalkyl group or monovalent heterocyclic group is preferable.

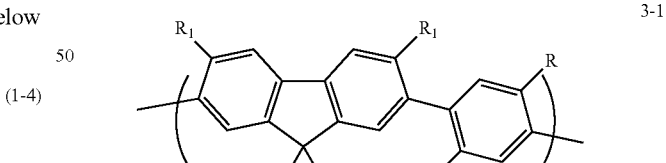

3-1

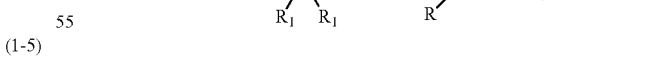

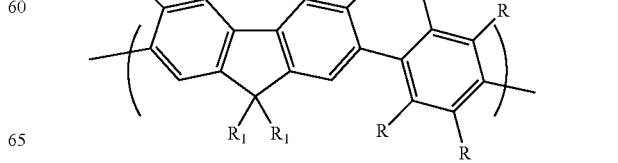

3-2

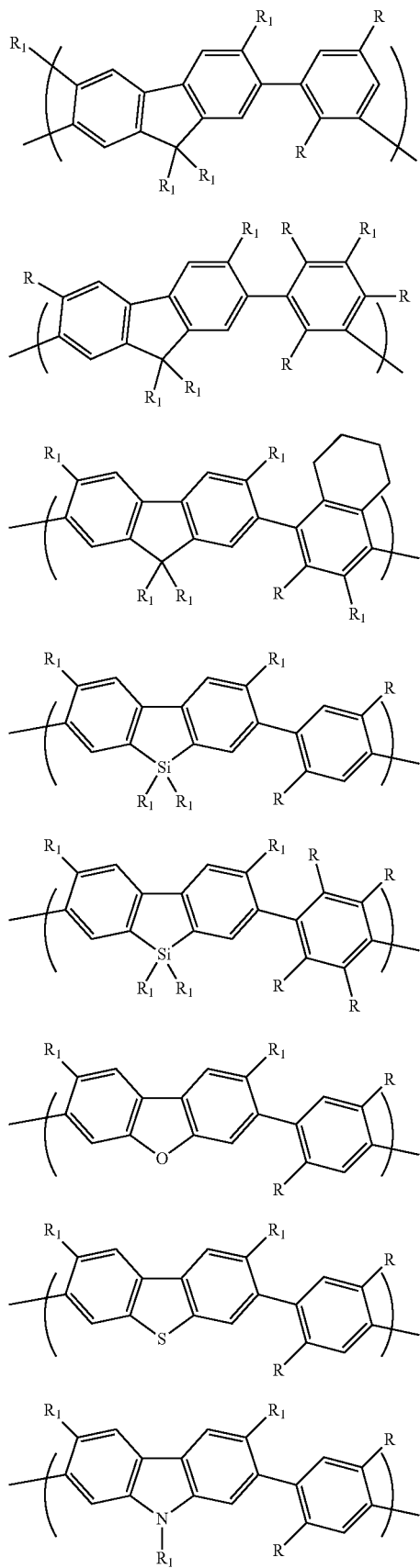
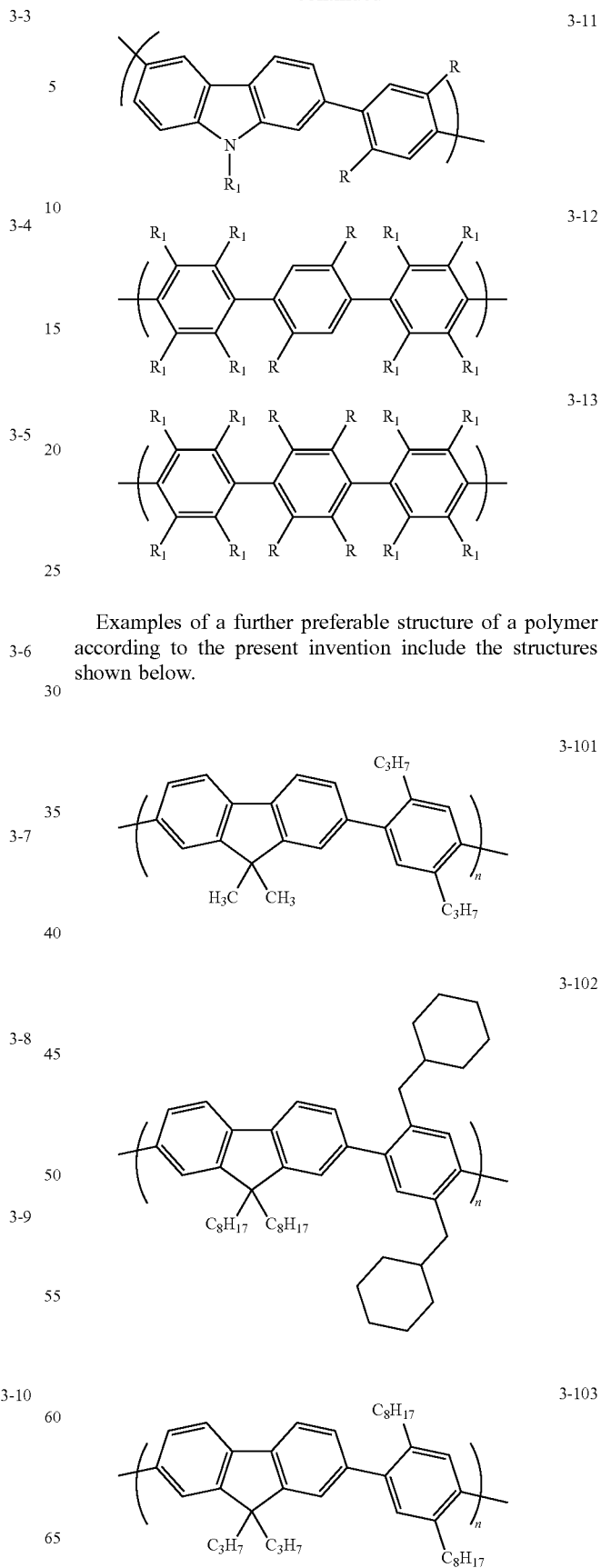
Examples of a further preferable structure of a polymer according to the present invention include the structures shown below.

-continued
3-104
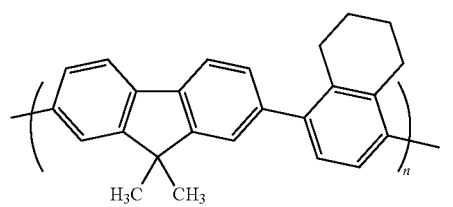
3-105
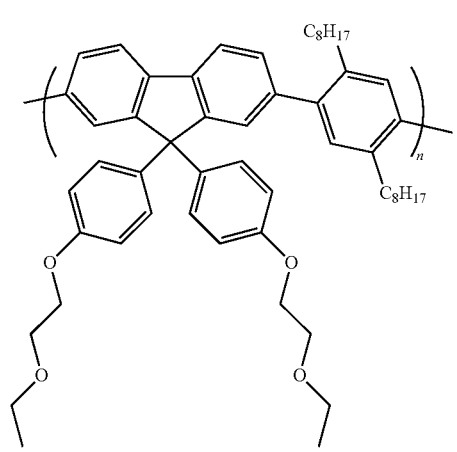
3-106
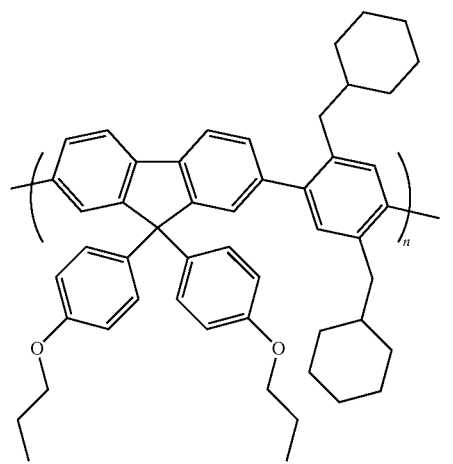
3-107
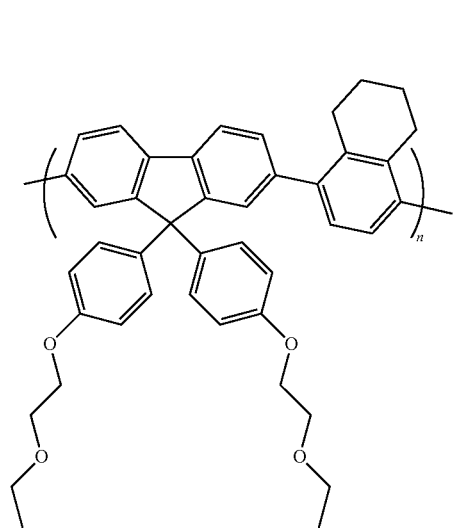
-continued
3-108
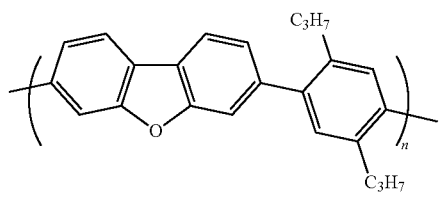
3-109
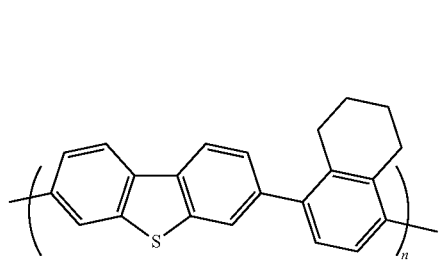
3-110
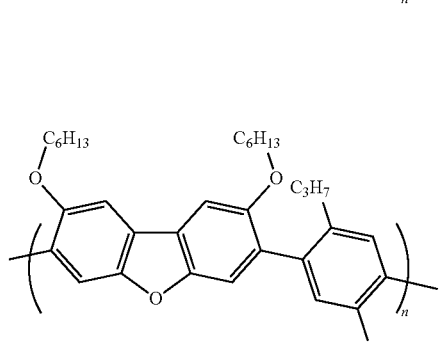
3-111
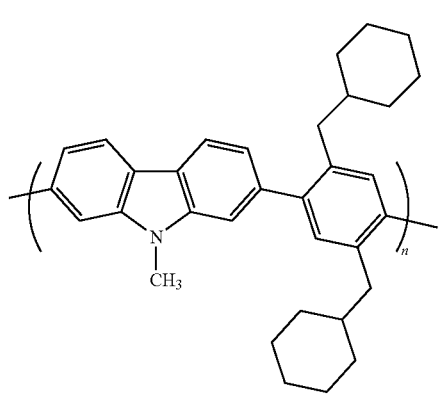
3-112
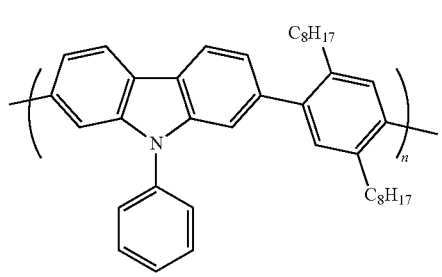

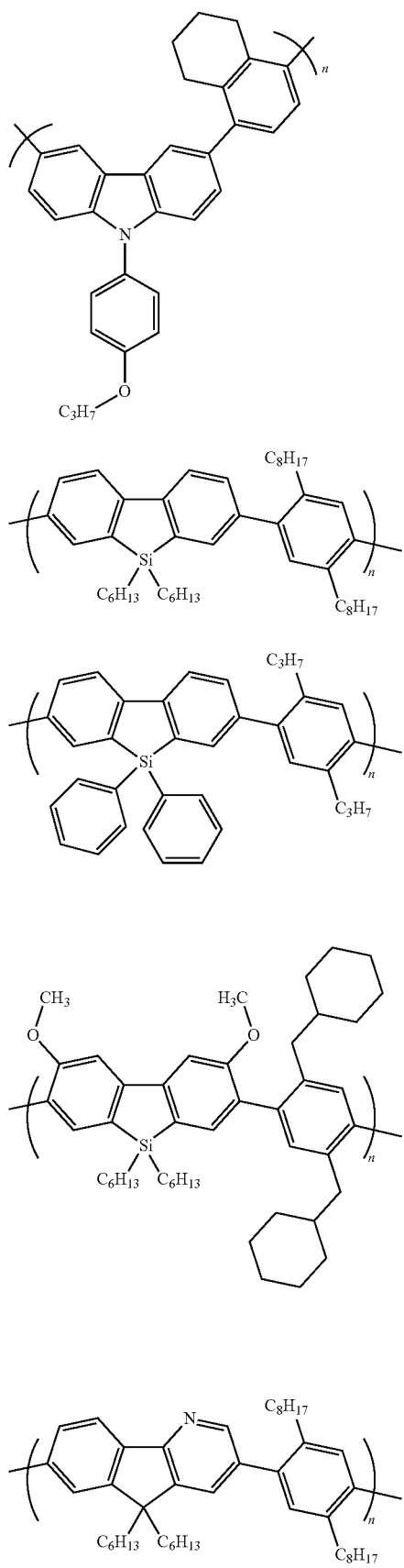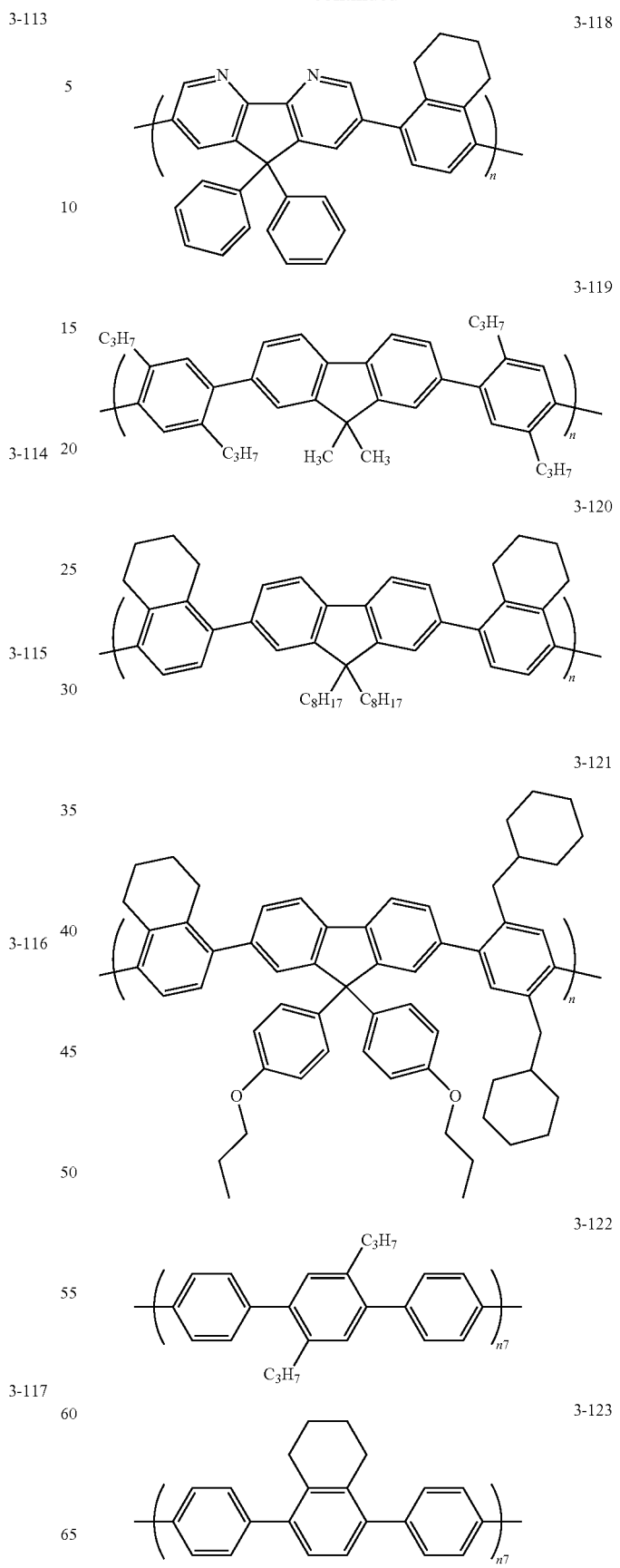

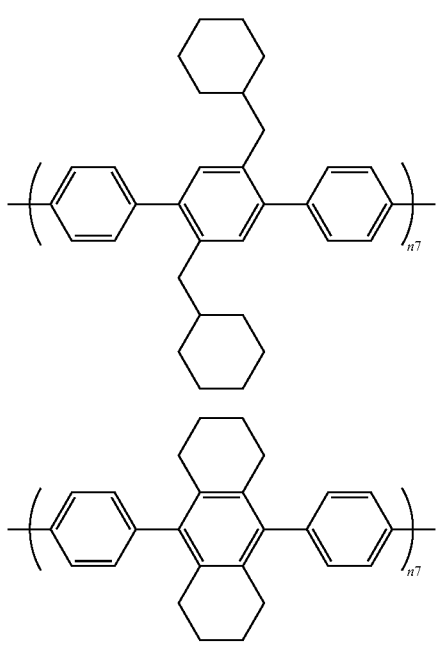

3-124

3-125

A composition according to the present invention may further contain a side component. For example, the composition used herein may contain a polymer according to the invention and at least one type of material selected from a hole transport material, electron transport material and luminescent material.

As a charge transport material, a hole transport material and an electron transport material may be mentioned. Examples of the hole transport material include known hole transport materials so far used in organic EL device such as an aromatic amine, carbazole derivative and a polyparaphenylene derivative. Examples of the electron transport materials also include known electron transport materials so far used in organic EL device. More specifically, mention may be made of metal complexes of an oxadiazole derivative, anthraquinodimethane or a derivative thereof, benzoquinone or a derivative thereof, naphthoquinone or a derivative thereof, anthraquinone or a derivative thereof, tetracyano-anthraquino-dimethane or a derivative thereof, fluorenone derivative, diphenyldicyanoethylene or a derivative thereof, diphenoquinone derivative, or 8-hydroxyquinoline or a derivative thereof. The low molecular weight organic compound of a charge transport material refers to a host compound and charge injection transportable compound used in low molecular weight organic EL device. Specific examples thereof may include compounds described in "Organic EL Display" (written by Seishi Tokito, Tihaya Adachi and Hideyuki Murata, published by Ohmsha, Ltd.) p. 107; Monthly Display, vol. 9, No. 9, 2003, p. 26-30, JP-A-2004-244400 and 2004-277377.

As the charge transport material, a polymer can be used. As the polymer, a non conjugated polymer and a conjugated polymer may be mentioned. As the non conjugated polymer, for example, a polyvinylcarbazole may be mentioned. As the conjugated polymer, mention may be made of a conjugated polymer according to item 1 or 2 unless it significantly inhibits light emission. Examples thereof may include polyfluorene, polydibenzothiophene, polydibenzofuran and polydibenzosilole.

When a polymer is used in a composition according to the present invention, the number average molecular weight of the polymer in terms of polystyrene is preferably $10^3$ to $10^8$ and further preferably $10^4$ to $10^6$. The weight average molecular weight of the polymer in terms of polystyrene is preferably $10^3$ to $10^8$ and further preferably $5 \times 10^4$ to $5 \times 10^6$.

A composition according to the present invention may contain not only a charge transport material but also a luminescent material. Examples of the luminescent material may include the same compounds exemplified as luminescent compounds above.

When a composition according to the present invention contains a phosphorescent molecule emitting light from the triplet excited state, the lowest triplet excitation energy of the polymer (ETP) and the lowest triplet excitation energy of the luminescent material (ETT) emitting light from the triplet excited state, contained in the composition, preferably satisfy the condition:

$$ETT>ETP-0.2 \text{ (eV)} \tag{4}$$

As the luminescent material emitting light from the triplet excited state used in combination with a polymer, any compound may be used as long as it satisfies the condition of the aforementioned equation (4). A compound having a metal complex structure is preferably used. Specific examples may include those mentioned above.

An ink composition according to the present invention is characterized by containing a polymer or composition according to the present invention. As the ink composition, any composition may be used as long as at least one type of conjugated polymer or a composition according to the present invention is contained. Besides this, a hole transport material, an electron transport material, a luminescent material, a solvent and additives such as a stabilizer may be contained.

The ratio of solid matter including a conjugated polymer or a composition of the present invention in the ink composition is generally 20 wt % to 100 wt % and preferably 40 wt % to 100 wt % relative to the total weight of the composition excluding the solvent.

When a solvent is contained in an ink composition, the ratio of the solvent is 1 wt % to 99.9 wt %, preferably 60 wt % to 99.5 wt %, and further preferably, 80 wt % to 99.0 wt %, relative to the total weight of the composition.

The viscosity of the ink composition varies depending upon the printing method. When an ink composition is passed through an ejection apparatus as is in the case of inkjet printing, the viscosity at 25° C. preferably falls within the range of 1 to 20 mPa·s in order to prevent clogging of ejection nozzles and spray liquid droplets from flying away from a right direction.

An ink composition according to the present invention (hereinafter, simply refers to as "the solution" or "the solution of the invention") may contain not only a polymer or a composition according to the present invention but also additives for controlling viscosity and/or surface tension. Examples of the additives may include a polymer compound (thickner) of a high molecular weight or a poor solvent for increasing viscosity, a compound of a low molecular weight for decreasing viscosity, and a surfactant for reducing surface tension. These additives may be used in an appropriate combination.

As the polymer compound (thickner) of a high molecular weight, any polymer may be used as long as it can be dissolved in the same solvent that dissolves a conjugated polymer or composition according to the present invention and unless it blocks emission or charge transport. For example, polystyrene and polymethylmethacrylate of a high molecular weight can be used. The weight average molecular weight thereof is preferably 500,000 or more and more preferably 1,000,000 or more.

A poor solvent may be used as a thickner. Viscosity can be increased by adding a small amount of poor solvent for the solid matter to the solution. When a poor solvent is added for this purpose, the type and addition amount of solvent may be selected within the range where no solid matter precipitates in the solution. In consideration of storage stability, the amount of poor solvent is preferably 50 wt % or less and further preferably 30 wt % or less relative to the entire amount of the solution.

A solution according to the present invention may contain not only a conjugated polymer or a composition according to the present invention but also an antioxidant in order to improve storage stability. As the antioxidant, any compound may be used as long as it is soluble in the same solvent as a conjugated polymer or a composition according to the present invention and as long as it does not block light-emission and charge transport. Mention may be made of a phenol based antioxidant and a phosphor based antioxidant.

As a solvent for use in forming a film from a solution, a solvent that can dissolve or homogeneously disperse a hole transport material is preferable. Examples of the solvent include chlorine based solvents such as chloroform, methylene chloride, 1,2-dichloroethane, 1,1,2-trichloroethane, chlorobenzene and o-dichlorobenzene; ether based solvents such as tetrahydrofuran and dioxane; aromatic hydrocarbon based solvents such as toluene and xylene; aliphatic hydrocarbon based solvents such as cyclohexane, methylcyclohexane, n-pentane, n-hexane, n-heptane, n-octane, n-nonane and n-decane; ketone based solvents such as acetone, methylethylketone and cyclohexanone; ester based solvents such as ethyl acetate, butyl acetate and ethyl cellosolve acetate; polyhydric alcohols and derivatives thereof such as ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerin and 1,2-hexane diol; alcohol based solvents such as methanol, ethanol, propanol, isopropanol and cyclohexanol; sulfoxide based solvents such as dimethylsulfoxide; amido based solvents such as N-methyl-2-pyrrolidone and N,N-dimethylformamide. These organic solvents may be used singly or in combination of two or more. At least one type of organic solvent selecting from the aforementioned solvents, having at least one benzene ring, a melting point of 0° C. or less and a boiling point of 100° C. or more is preferably contained.

As the type of solvent, an aromatic hydrocarbon based solvent, aliphatic hydrocarbon based solvent, ester based solvent and ketone based solvent are preferable in view of solubility to an organic solvent, uniformity of a formed film, and viscosity. Preferable examples of the solvent include toluene, xylene, ethylbenzene, diethylbenzene, trimethylbenzene, n-propylbenzene, isopropylbenzene, n-butylbenzene, isobutylbenzene, s-butylbenzene, anisole, ethoxybenzene, 1-methylnaphthalene, cyclohexane, cyclohexanone, cyclohexylbenzene, bicyclohexyl, cyclohexenylcyclohexanone, n-heptylcyclohexane, n-hexylcyclohexane, 2-propylcyclohexanone, 2-heptanon, 3-heptanon, 4-heptanon, 2-octanone, 2-nonanon, 2-decanone and dicyclohexyl ketone. More preferably, at least one type of solvent of xylene, anisole, cyclohexylbenzene and bicyclohexyl may be contained.

The number of types of solvents used in the solution is at least 2 or more preferably, 2 to 3, and further preferably, 2, in view of film-formability and element characteristics.

When two types of solvents are contained in a solution, one of which may present in a solid state at 25° C. In view of film-formability, it is preferable that one of the solvents has a boiling point of 180° C. or more, whereas the other solvent has a boiling point of 180° C. or less. It is more preferable that one of the solvents has a boiling point of 200° C. or more, whereas the other solvent has a boiling point of 180° C. or less. Furthermore, when a polymer compound is used as a composition, it is preferable, in view of viscosity, that both of the two solvents can dissolve not less than 1 wt % of a polymer compound at 60° C. One of the two types of solvents preferably dissolves not less than 1 wt % of a polymer compound at 25° C.

When 3 types of solvents are contained in a solution, 1 to 2 types of solvents may be present in a solid state at 25° C. In view of film-formability, it is preferable that at least one of the 3 types of solvents has a boiling point of 180° C. or more and at least one of the solvents has a boiling point 180° C. or less. It is more preferable that at least one of the 3 types of solvents has a boiling point of 200° C. to 300° C. (both inclusive) and at least one type of the solvents has a boiling point 180° C. or less. In view of viscosity, it is preferable that 2 solvents of the 3 types of solvents preferably dissolve not less than 1 wt % of a polymer compound at 60° C. and one of the 3 types of solvents preferably dissolves not less than 1 wt % of a polymer compound at 25° C.

When at least 2 types of solvents are contained in the solution, the solvent having the highest boiling point is preferably contained in an amount of 40 to 90 wt %, more preferably, 50 to 90 wt % and further preferably 65 to 85 wt % based on the weight of the all solvents contained in the solution, in view of viscosity and film-formability.

As a solution of the present invention, in view of viscosity and film-formability, use may be preferably made of a solution containing anisole and bicyclohexyl, a solution containing anisole and cyclohexylbenzene, a solution containing xylene and bicyclohexyl, and a solution containing xylene and cyclohexylbenzene.

When a polymer compound is used as a composition, in view of solubility of the polymer compound to a solvent, the difference between the solubility parameter of the solvent and that of the polymer compound is preferably 10 or less and more preferably 7 or less.

The solubility parameter of a solvent and the solubility parameter of a polymer compound can be obtained by the method described in "Solvent Handbook" (published by Kodansha Ltd., 1976).

An ink composition according to the present invention preferably has a viscosity of 1 to 100 mPa·s at 25'C.

A conjugated polymer or a composition according to the present invention can be used not only as a luminescent material for a luminous thin film but also as an organic semiconductor material, optical material, or an electroconductive material by doping it.

Next, an opt-electric device according to the present invention will be described. The opt-electric device of the present invention is characterized by having a layer containing a metal complex or a composition according to the present invention between the electrodes consisting of an anode and a cathode, and used, for example, as a light-emitting device, switching element and photoelectric conversion element. When the element is used as a light-emitting device, the layer containing a conjugated polymer or a composition according to the present invention preferably serves as a light emitting layer.

An opt-electric device according to the present invention may contain a charge transport layer or a charge blocking layer between the electrodes consisting of an anode and a cathode. The charge transport layer herein refers to a hole transport layer or an electron transport layer. The charge blocking layer refers to a hole blocking layer or an electron blocking layer. Examples thereof include a light-emitting device having an electron transport layer or a hole blocking layer between a cathode and a photoelectric layer; a light-emitting device having a hole transport layer or an electron blocking layer between an anode and a photoelectric layer; and a light-emitting device having an electron transport layer or a hole blocking layer between a cathode and a photoelectric layer as well as a hole transport layer or an electron block layer between an anode and the photoelectric layer. The functions of the electron transport layer and hole blocking layer used herein are the same. Both layers can be formed of the same material, as described in "All about organic EL". p. 162 (written by Junji Shiroto, Nippon Jitsugyo Publishing Co., Ltd.). Either one of the functions is sometimes strongly expressed depending upon the characteristics of the material. The same feature as this may be said with respect to the hole transport layer and electron blocking layer. The element structure of a light-emitting device according to the present invention is, for example, described in Patent Document (Journal of the SID 11/1, 161-166, 2003).

Additional examples of an opt-electric device according to the present invention include a light-emitting device having a layer containing a conductive polymer between at least one of the electrodes and a photoelectric layer and in adjacent to the electrode; and a light-emitting device having a buffer layer having an average thickness of 2 nm or less between at least one of the electrodes and a photoelectric layer and in adjacent to the electrode.

More specifically, the following structures (a) to (d) may be mentioned.

a) Anode/photoelectric layer/cathode
b) Anode/hole transport layer/photoelectric layer/cathode
c) Anode/photoelectric layer/electron transport layer/cathode
d) Anode/hole transport layer/photoelectric layer/electron transport layer/cathode (Symbol "/" means that individual layers are laminated in adjacent to each other. The same definition will be employed hereinafter.)

The photoelectric layer is a layer having a photoelectric function, in other words, a thin film having luminosity, conductivity or photoelectric conversion function. The hole transport layer is a layer having a function of transporting holes. The electron transport layer is a layer having a function of transporting electrons. Note that the electron transport layer and hole transport layer are collectively called as a charge transport layer.

The number of photoelectric layers, hole transport layers and electron transport layers may be each independently 2 or more.

Of the charge transport layers provided in adjacent to an electrode, the layer having a function of improving charge injection efficiency from the electrode, thereby effectively reducing the drive voltage of an element is generally called particularly as a charge injection layer (hole injection layer or electron injection layer).

To improve adhesion to an electrode and to improve charge injection from the electrode, a charge injection layer as mentioned above or an insulating layer having a thickness of 2 nm or less may be provided in adjacent to the electrode. Alternatively, for improving the adhesion to the interface, preventing contamination and for other purpose, a thin buffer layer may be inserted between the charge transport layer and the photoelectric layer.

Furthermore, a hole blocking layer may be inserted between the interface with the photoelectric layer in order to transport electrons and confine holes.

The laminate order, number, and thickness of layers may be appropriately set in view of luminous efficiency and the working life of an element.

In the present invention, examples of a light-emitting device having a charge injection layer (electron injection layer and hole injection layer) include a light-emitting device having a charge injection layer in adjacent to a cathode; and a light-emitting device having a charge injection layer in adjacent to an anode.

Specific examples thereof are light-emitting devices having the following structures (e) to (p).

e) anode/charge injection layer/photoelectric layer/cathode
f) anode/photoelectric layer/charge injection layer/cathode
g) anode/charge injection layer/photoelectric layer/charge injection layer/cathode
h) anode/charge injection layer/hole transport layer/photoelectric layer/cathode
i) anode/hole transport layer/photoelectric layer/charge injection layer/cathode
j) anode/charge injection layer/hole transport layer/photoelectric layer/charge injection layer/cathode
k) anode/charge injection layer/photoelectric layer/charge transport layer/cathode
l) anode/photoelectric layer/electron transport layer/charge injection layer/cathode
m) anode/charge injection layer/photoelectric layer/electron transport layer/charge injection layer/cathode
n) anode/charge injection layer/hole transport layer/photoelectric layer/charge transport layer/cathode
o) anode/hole transport layer/photoelectric layer/electron transport layer/charge injection layer/cathode
p) anode/charge injection layer/hole transport layer/photoelectric layer/electron transport layer/charge injection layer/cathode Specific examples of the charge injection layer include a layer containing a conductive polymer; a layer provided between an anode and a hole transport layer and containing a material having an ionization potential, which is a medium value between that of an anode material and that of a hole transport material contained in the hole transport layer; and a layer provided between a cathode and an electron transport layer and containing a material having an electron affinity, which is a medium value between that of a cathode material and that of an electron transport material contained in the electron transport layer.

When the charge injection layer is the layer containing a conductive polymer, the electric conductivity of the conductive polymer is preferably from $10^{-5}$ S/cm to $10^3$ S/cm (both inclusive). To reduce leak current between light emitting pixels, the electric conductivity is preferably from $10^{-5}$ S/cm to $10^2$ S/cm (both inclusive), and further preferably, from $10^{-5}$ S/cm to $10^1$ S/cm (both inclusive)

To set the electric conductivity of the conductive polymer at $10^{-5}$/cm to $10^3$ S/cm (both inclusive), generally an appropriate amount of ions is doped into the conductive polymer.

The type of ion to be doped into a hole injection layer is anion and cation to an electron injection layer. Examples of the anion include polystyrene sulfonate ions, alkylbenzene sulfonate ions and camphor sulfonate ions. Examples of the cation include lithium ions, sodium ions, potassium ions and tetrabutylammonium ions.

The film thickness of the charge injection layer is, for example, 1 nm to 100 nm and preferably 2 nm to 50 nm.

The material to be used in the charge injection layer may be appropriately selected in consideration of the materials used in the electrode and the layer adjacent thereto. Examples thereof include polyaniline and a derivative thereof, a polyaminophene and a derivative thereof, polypyrrole and a derivative thereof, polyphenylenevinylene and a derivative thereof, polythienylenevinylene and a derivative thereof, polyquinoline and a derivative thereof, polyquinoxaline and a derivative thereof, electroconductive polymers such as a polymer containing an aromatic amine structure in the main chain or a side chain thereof, metallophthalocyanine (e.g. copper phthalocyanine) and carbon.

The insulating layer having a film thickness of 2 nm or less has a function of facilitating charge injection. Examples of the material for the insulating layer include a metal fluoride, metal oxide and organic insulating material. Examples of the light-emitting device having an insulating layer having a film thickness of 2 nm or less include a light-emitting device, which has an insulating layer having a film thickness of 2 nm or less in adjacent to a cathode, and a light-emitting device, which has an insulating layer having a film thickness of 2 nm or less in adjacent to an anode.

Specific examples thereof are light-emitting devices having the following structures q) to ab).

q) anode/insulating layer of 2 nm thickness/photoelectric layer/cathode r) anode/photoelectric layer/insulating layer of 2 nm thickness/cathode s) anode/insulating layer of 2 nm thickness/photoelectric layer/insulating layer of 2 nm thickness/cathode t) anode/insulating layer of 2 nm thickness/hole transport layer/photoelectric layer/cathode u) anode/hole transport layer/photoelectric layer/insulating layer of 2 nm thickness/cathode v) anode/insulating layer of 2 nm thickness/hole transport layer/photoelectric layer/insulating layer of 2 nm thickness/cathode w) anode/insulating layer of 2 nm thickness/photoelectric layer/electron transport layer/cathode x) anode/photoelectric layer/electron transport layer/insulating layer of 2 nm thickness/cathode y) anode/insulating layer of 2 nm thickness/photoelectric layer/electron transport layer/insulating layer of 2 nm thickness/cathode z) anode/insulating layer of 2 nm thickness/hole transport layer/photoelectric layer/electron transport layer/cathode aa) anode/hole transport layer/photoelectric layer/electron transport layer/insulating layer of 2 nm thickness/cathode ab) anode/insulating layer of 2 nm thickness/hole transport layer/photoelectric layer/electron transport layer/insulating layer of 2 nm thickness/cathode.

The hole blocking layer has a function of transferring electrons and confining holes transported from an anode, provided on the interface of a photoelectric layer facing the cathode and composed of a material having a larger ionization potential than that of the photoelectric layer, such as Bathocuproine or a metallic complex of 8-hydroxyquinoline or a derivative thereof.

The film thickness of the hole blocking layer is, for example, 1 nm to 100 nm and preferably 2 nm to 50 nm.

Specific examples thereof are light-emitting devices having the following structures ac) to an).

ac) anode/charge injection layer/photoelectric layer/hole blocking layer/cathode ad) anode/photoelectric layer/hole blocking layer/charge injection layer/cathode ae) anode/charge injection layer/photoelectric layer/hole blocking layer/charge injection layer/cathode af) anode/charge injection layer/hole transport layer/photoelectric layer/hole blocking layer/cathode ag) anode/hole transport layer/photoelectric layer/hole blocking layer/charge injection layer/cathode ah) anode/charge injection layer/hole transport layer/photoelectric layer/hole blocking layer/charge injection layer/cathode ai) anode/charge injection layer/photoelectric layer/hole blocking layer/charge transport layer/cathode aj) anode/photoelectric layer/hole blocking layer/electron transport layer/charge injection layer/cathode ak) anode/charge injection layer/photoelectric layer/hole blocking layer/electron transport layer/charge injection layer/cathode al) anode/charge injection layer/hole transport layer/photoelectric layer/hole blocking layer/charge transport layer/cathode am) anode/hole transport layer/photoelectric layer/hole blocking layer/electron transport layer/charge injection layer/cathode an) anode/charge injection layer/hole transport layer/photoelectric layer/hole blocking layer/electron transport layer/charge injection layer/cathode In manufacturing an opt-electric device according to the present invention, a film of a photoelectric material including a charge transport material is formed from a solution. In this case, the film can be formed just by applying the solution and removing the solvent by dehydration. In the case where a charge transport material and luminescent material are mixed, the same manner can be applied. This is very advantageous in manufacturing. Examples of the method for forming a film from a solution include coating methods such as spin coat method, casting method, microgravure coat method, gravure coat method, bar coat method, roll coat method, wire-bar coat method, dip coat method, spray coat method, screen printing, flexographic printing method, offset printing method and inkjet printing method. When a luminescent material including a charge transport material has a relative low molecular weight, a photoelectric layer may be formed by a vacuum deposition method.

In a light-emitting device according to the present invention, a luminescent material other than a photoelectric material according to the present invention may be used in combination in the photoelectric layer, that is, a light emitting layer. Furthermore, in the opt-electric device of the present invention, the light emitting layer containing the luminescent material other than a photoelectric material according to the present invention is laminated with a photoelectric layer containing a luminescent material according to the present invention.

As the luminescent material, a known compound may be used. As the known compound having a low molecular weight, for example, use may be made of a naphthalene derivative, anthracene or a derivative thereof, perylene or a derivative thereof, pigments such as polymethine based, xanthene based, coumarin based and cyanine based pigments, a metal complex of 8-hydroxyquinoline or a derivative thereof, aromatic amine, tetraphenylcyclopentadiene or a derivative thereof, or tetraphenyl butadiene or a derivative thereof.

More specifically, the known compounds such as those described in JP-A-57-51781 and 59-194393 may be used.

When an opt-electric device according to the present invention has a hole transport layer, as an example of the hole transport material to be used, use may be made of polyvinylcarbazole or a derivative thereof, polysilane or a derivative thereof, a polysiloxane derivative having an aromatic amine in a side chain thereof or the main chain, a pyrazoline derivative, an arylamine derivative, a stilbene derivative, a triphenyldiamine derivative, polyaniline or a derivative thereof, polyaminofen or a derivative thereof, polypyrrole or a derivative thereof, poly(p-phenylenevinylene) or a derivative thereof, or poly(2,5-thienylenevinylene) or a derivative thereof.

Specific examples of the hole transport material include those described in JP-A-63-70257, 63-175860, 2-135359, 2-135361, 2-209988, 3-37992 and 3-152184.

Of them, as a hole transport material to be used in the hole transport layer, for example, use may be preferably made of polymer hole transport materials such as polyvinylcarbazole or a derivative thereof, polysilane or a derivative thereof, a polysiloxane derivative having an aromatic amine compound group in a side chain or the main chain thereof, polyaniline or a derivative thereof, polyaminofen or a derivative thereof, poly(p-phenylenevinylene) or a derivative thereof, or poly(2,5-thienylenevinylene) or a derivative thereof; and more preferably, polyvinylcarbazole or a derivative thereof, or polysilane or a derivative thereof, a polysiloxane derivative having an aromatic amine compound group in a side chain or the main chain thereof. In the case of a low molecular weight hole transport material, it is preferably used by dispersing it in a polymer binder.

The polyvinylcarbazole or a derivative thereof can be obtained from a vinyl monomer by cation polymerization or radical polymerization.

Examples of the polysilane or a derivative thereof include the compounds described in Chem. Rev. Vol. 89, p. 1359 (1989) and the published specification of British Patent GB 2300196. They can be synthesized by the methods described in these documents. In particular, a kipping method is suitably used.

Since a siloxane skeleton structure has virtually no transportability of holes, polysiloxane or a derivative thereof having a structure of the low molecular weight hole transporting material in a side chain or the main chain thereof is suitably used. In particular, mention is made of polysiloxane or a derivative thereof having an aromatic amine in a side chain or the main chain thereof.

A method for forming a film of a hole transport layer is not particularly limited; however, when a low-molecular weight hole transport material is used, a method for forming a film from a solution mixture containing a polymer binder is exemplified. When a high molecular weight hole transport material is used, a method for forming a film from a solution is exemplified.

The solvent to be used in forming a film from a solution is not particularly limited as long as it can dissolve a hole transport material. Examples of the solvent include chlorine based solvents such as chloroform, methylene chloride and dichloroethane; ether based solvents such as tetrahydrofuran; aromatic hydrocarbon based solvents such as toluene and xylene; ketone based solvents such as acetone and methylethyl ketone; and ester based solvents such as ethyl acetate and butyl acetate and ethylcellosolve acetate.

Examples of the method for forming a film from a solution include coating methods such as a spin coat method, casting method, microgravure coat method, gravure coat method, bar coat method, roll coat method, wire-bar coat method, dip coat method, spray coat method, screen printing, flexographic printing method, offset printing method and inkjet printing method.

As the polymer binder to be mixed, one that cannot extremely block charge transport is preferably used and one whose absorption for visible light is low is suitably used. Examples of the polymer binder include polycarbonate, polyacrylate, polymethylacrylate, polymethylmethacrylate, polystyrene, polyvinylchloride and polysiloxane.

The most suitable film thickness of a hole transport layer varies depending upon the material to be used and may be chosen so as to obtain an appropriate drive voltage and luminous efficiency. The hole transport layer must have an appropriate thickness so that formation of a pin hole is at least prevented. When the film is excessively thick, the drive voltage of the element undesirably increases. Accordingly, the film thickness of the hole transport layer is, for example, from 1 nm to 1 μm, preferably 2 nm to 500 nm, and further preferably, 5 nm to 200 nm.

When an opt-electric device according to the present invention has an electron transport layer, a known electron transport material may be used. As an example, use may be made of a metal complex of an oxadiazole derivative, anthraquinodimethane or a derivative thereof, benzoquinone or a derivative thereof, naphthoquinone or a derivative thereof, anthraquinone or a derivative thereof, tetracyanoanthraquinodimethane or a derivative thereof, a fluorenone derivative, diphenyldicyanoethylene or a derivative thereof, a diphenoquinone derivative, or 8-hydroxyquinoline or a derivative thereof; polyquinoline or a derivative thereof; polyquinoxaline or a derivative thereof; or polyfluorene or a derivative thereof.

Specific examples of the electron transport material include those described, for example, in JP-A-63-70257, 63-175860, 2-135359, 2-135361, 2-209988, 3-37992 and 3-152184.

Of them, a metal complex of an aminoxadiazole derivative, benzoquinone or a derivative thereof, anthraquinone or a derivative thereof, or 8-hydroxyquinoline or a derivative thereof; polyquinoline or a derivative thereof; polyquinoxaline or a derivative thereof; polyfluorene or a derivative thereof is preferable; and 2-(4-biphenylyl)-5-(4-t-butylphenyl)-1,3,4-oxadiazole, benzoquinone, anthraquinone, tris(8-quinolinol)aluminum or polyquinoline is further preferable.

A method of forming a film of an electron transport layer is not particularly limited; however, when a low-molecular weight electron transport material is used, a vacuum deposition method for forming a film from powder or a method of forming a film from a solution or a molten state is exemplified. When a high molecular weight electron transport material is used, a method of forming a film from a solution or a molten state is exemplified. When a film formed from a solution or a molten state, a polymer binder may be used in combination.

The solvent to be used in forming a film from a solution is not particularly limited as long as it can dissolve an electron transport material and/or a polymer binder. Examples of the solvent include chlorine based solvents such as chloroform, methylene chloride and dichloroethane; ether based solvents such as tetrahydrofuran; aromatic hydrocarbon based solvents such as toluene and xylene; ketone based solvents such as acetone and methylethyl ketone; and ester based solvents such as ethyl acetate and butyl acetate and ethylcellosolve acetate.

Examples of the method for forming a film from a solution or a molten state include coating methods such as a spin coat method, casting method, microgravure coat method, gravure coat method, bar coat method, roll coat method, wire-bar coat method, dip coat method, spray coat method, screen printing, flexographic printing method, offset printing method and inkjet printing method.

As the polymer binder to be mixed, one that cannot extremely block charge transport is preferable and one whose absorption of light is low is suitably used. As an example of the polymer binder, use may be made of poly (N-vinylcarbazole), polyaniline or a derivative thereof, polyaminofen or a derivative thereof, poly(p-phenylenevinylene) or a derivative thereof, poly(2,5-thienylenevinylene) or a derivative thereof, polycarbonate, polyacrylate, polymethylacrylate, polymethylmethacrylate, polystyrene, polyvinylchloride or polysiloxane.

The most suitable film thickness of an electron transport layer varies depending upon the material to be used and may be chosen so as to obtain an appropriate drive voltage and luminous efficiency. The electron transport layer must have an appropriate thickness so that formation of a pin hole is at least prevented. When the film is excessively thick, the drive voltage of the element undesirably increases. Accordingly, the film thickness of the electron transport layer is, for example, from 1 nm to 1 µm, preferably 2 nm to 500 nm, and further preferably, 5 nm to 200 nm.

As a substrate on which an opt-electric device according to the present invention is to be formed, any substrate may be used as long as it is not affected when electrode and individual layers of the opt-electric device are formed. Examples of the substrate include glass, plastic, polymer film and silicon substrates. When an opaque substrate is used, the electrode placed in opposite thereto is preferably transparent or translucent.

Generally, at least one of the electrodes consisting of an anode and a cathode is transparent or translucent, and more preferably, the anode is transparent or translucent.

As the material for the anode, a conductive metal oxide film or a translucent metal thin film is used. Specific examples include indium oxide, zinc oxide, tin oxide and an indium/tin/oxide (ITO), which is a complex of these, and film (NESA) formed of an electroconductive glass of an indium/zinc/oxide and the like, gold, platinum, silver and copper. Of them, ITO, indium/zinc/oxide and tin oxide are preferable. Examples of the film formation method include a vacuum deposition method, sputtering method, ion plating method and plating method. Furthermore, as the anode, use may be made of a transparent electroconductive film made of an organic compound such as polyaniline or a derivative thereof, or a polyaminofen or a derivative thereof.

The film thickness of the anode can be appropriately selected in consideration of light permeability and electroconductivity. The film thickness is, for example, 10 nm to 10 µm, preferably 20 nm to 1 µm and further preferably, 50 nm to 500 nm.

To facilitate charge injection into the anode, a layer formed of a phthalocyanine derivative, electroconductive polymer or carbon, or a layer having an average thickness of 2 nm or less and formed of a metal oxide, metal fluoride or organic insulating material may be provided.

As the material for a cathode to be used in a light-emitting device according to the present invention, a material having a small work function is preferable. For example, mention may be made of a metal such as lithium, sodium, potassium, rubidium, cesium, beryllium, magnesium, calcium, strontium, barium, aluminum, scandium, vanadium, zinc, yttrium, indium, cerium, samarium, europium, terbium or ytterbium; an alloy formed of two or more types of metals selected from these, an alloy formed of at least one type of metals selected from these and at least one type of metal selected from gold, silver, platinum, copper, manganese, titanium, cobalt, nickel, tungsten and tin; or graphite or a graphite interlayer compound. Examples of the alloys include magnesium-silver alloy, magnesium-indium alloy, magnesium-aluminum alloy, indium-silver alloy, lithium-aluminum alloy, lithium-magnesium alloy, lithium-indium alloy and calcium-aluminum alloy. A laminate structure formed of two or more layers may be used as a cathode.

The film thickness of the cathode may be appropriately selected in consideration of electroconductivity and durability. The film thickness is, for example, from 10 nm to 10 µm, preferably 20 nm to 1 µm, and further preferably, 50 nm to 500 nm.

As the film formation method for a cathode, use may be made of a vacuum deposition method, sputtering method or laminate method employing thermocompression bonding of metal thin films. Furthermore, a layer formed of an electroconductive polymer or a layer having an average thickness of 2 nm or less and formed of a metal oxide, metal fluoride or organic insulating material may be provided between the cathode and an organic compound layer. Alternatively, after the cathode is formed, a protective layer for protecting the light-emitting device may be applied. To use the light-emitting device stably for a long time, a protective layer and/or a protection cover may be applied in order to protect the device from the outside world.

As the protective layer, use may be made of a polymer compound, metal oxide, metal fluoride and metal boride. As the protection cover, use may be made of a glass board and a plastic board whose surface is treated so as to reduce water permeability. A method of bonding the cover to a device substrate with a thermosetting resin or a photosetting resin to seal them is suitably used. When a spacer is used to maintain a space, it is easy to protect the device from being damaged. If an inert gas such as nitrogen or argon is injected into the space, oxidation of the cathode can be prevented. Furthermore, if a desiccant such as barium oxide is placed in the space, it is easy to suppress water adsorbed in manufacturing steps from damaging the element. Of these, at least one measure is preferably taken.

A light-emitting device according to the present invention can be used as backlight or illumination for planar light sources, segment display devices, dot matrices and liquid crystal display devices.

To obtain a planer light emission using a light-emitting device according to the present invention, a planar anode and a planar cathode may be arranged so as to overlap with each other. Furthermore, to obtain pattern-form light emission, there are a method of providing a mask having a patterned window on the surface of the planar light-emitting device, a method of forming an organic compound layer that corresponds to the portion from which no light is emitted, extremely thick to substantially block light emission, and a method of forming either one or both of an anode and a cathode are formed so as to have a pattern. A pattern is formed by any one of these methods and several electrodes are arranged so as to turn on and off independently. In this manner, a segment-type display element can be obtained which can display numeric characters, letters and simple symbols. Furthermore, to obtain a dot matrix element, stripe form anode and cathode are formed and arranged so as to perpendicularly cross to each other. If a method of separately applying a plurality types of luminescent materials different in color or a method using a color filter or a light emission conversion filter is employed, partial color display and multicolor display can be attained. The dot matrix element can be passively driven or may be actively driven in combination with TFT and the like. These display elements can be used as display devices of computers, televisions, hand-held units, car navigation units and view finders of video cameras.

Furthermore, the planar light-emitting device is a thin film light emitting device and can be suitably used as a planar light source for backlight of liquid crystal display devices or a planar illumination light source. Moreover, when a flexible substrate is used, a curved-form light sources and curved-form display devices can be obtained.

Next, as another embodiment of an opt-electric device according to the present invention will be described.

As an opt-electric device, for example, a photoelectric conversion element may be mentioned. Examples thereof include an element having a layer containing a metal complex or a composition according to the present invention sandwiched between two pairs of electrodes at least one of which is transparent or translucent, and an element having a comb-form electrode, which is formed on a film-layer containing a polymer compound or a polymer composition according to the present invention and formed on a substrate. To improve characteristics, substances such as fullerene and carbon nanotube may be added.

As a method of producing a photoelectric conversion element, methods described in Japanese Patent No. 3146296 may be exemplified. More specifically, in a method, a polymer thin film is formed on a substrate having a first electrode and a second electrode is formed on the polymer thin film. In another method, a polymer thin film is formed on a pair of comb-form electrodes formed on a substrate. One of the first and second electrodes is transparent or translucent.

A method of forming a polymer thin film and a method of adding fullerene and carbon nanotube are not particularly limited, methods as exemplified with respect to a light-emitting device can be suitably used.

EXAMPLES

The present invention will now be described in detail by way of examples below; however, the present invention will not be limited to these.

In the following examples, photoluminescence was measured at an excitation wavelength of 350 nm by Fluorolog manufactured by HORIBA Ltd. or by an organic electro luminescence property evaluation apparatus IES-150 manufactured by Optel. A number average molecular weight in terms of polystyrene was obtained by gel permeation chromatography (GPC: HLC-8220GPC manufactured by Tosoh Corporation, or SCL-10A manufactured by Shimadzu Corporation) using tetrahydrofuran as a solvent.

Synthesis Example 1

Synthesis of Compound M-2

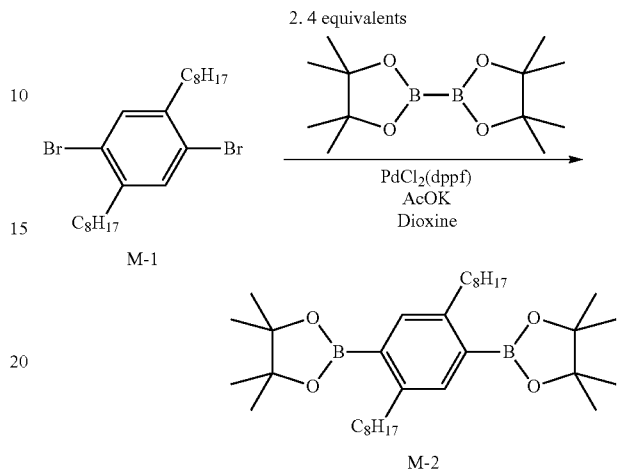

In a 500 ml three-neck flask, a compound M-1 (16.11 g, 35 mmol), pinacolate diborane (12.83 g, 84 mmol), $PdCl_2$(dppf) (1.7 g, 2.1 mmol), potassium acetate (20.6 g, 210 mmol) and dioxane (200 ml) were mixed under an argon atmosphere and refluxed for 11 hours. After reaction, the reaction mixture was cooled to room temperature, filtrated by cerite and concentrated. The concentrate was subjected to silica gel column chromatography (hexane/toluene=1:1) three times to obtain the compound M-2 (3.76 g, 19%).

$^1$H-NMR; δ0.88 (6H, t), 1.34 (12H, s), 1.12-1.55 (24H, m), 2.55 (6H, t), 2.81 (4H, t), 7.52 (2H, s).

The compound M-1 was synthesized in accordance with the method described in Macromol. Phys., 1997, 198, 3827-3843.

Synthesis Example 2

Synthesis of Compound M-3

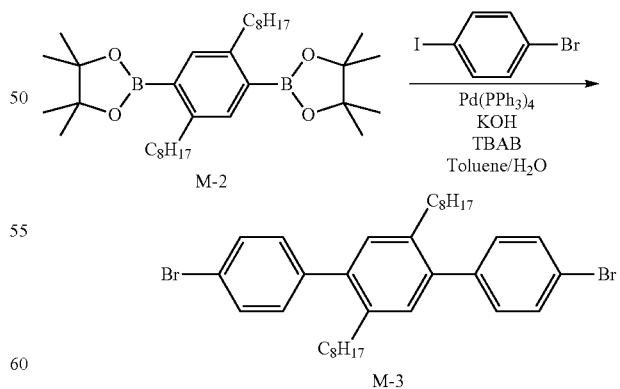

p In a 500 ml three-neck flask, the compound M-2 (4.44 g, 8.0 mmol), p-bromoiodobenzene (6.79 g, 24 mmol), Pd(PPh$_3$)$_4$ (550 mg, 0.48 mmol), potassium hydroxide (6.73 g, 90 mmol), tetrabutylammonium bromide (1.29 mg, 4.0 mmol), toluene (200 ml) and water (100 ml) were mixed under an argon atmosphere. The reaction mixture was heated to a temperature to 40° C. for 18 hours. After completion of the reaction, the reaction solution was cooled to room temperature, the organic layer was washed with water (100 ml×2), concentrated, dried and purified by silica gel column chromatography (toluene/hexane=1:1). The organic layer was concentrated, dried and sublimated to remove the raw material, p-bromoiodobenzene. The residue obtained was purified by silica gel column chromatography (hexane) to obtain the compound M-3 (2.8 g, 57%).

LC-MS (APCI method); m/z 611.2 ([M+H]$^+$).

Example 1

Synthesis of Polymer Compound (P-1)

The compound M-3 (0.800 g) and 2,2'-bipyridyl (0.551 g) were dissolved in dehydrated tetrahydrofuran (45 mL) previously bubbled with argon under an inert atmosphere. Subsequently, bis(1,5-cyclooctadiene)nickel(0){Ni(COD)$_2$} (0.970 g) was added and stirred. This solution mixture was raised in temperature to 60° C. and allowed to react for 3 hours.

The reaction solution was cooled to room temperature, added dropwise to a solution mixture of 25% ammonia water (2 mL)/methanol (48 mL)/ion-exchange water (50 mL) and stirred for one hour. The resultant precipitate was filtrated and dried under reduced pressure. Subsequently, the precipitate was dissolved in toluene (20 ml). To this solution, Radiolight (0.08 g) was added and stirred for 30 minutes. After insoluble matter was filtered off, the filtrate was passed through an alumina column to purify it. Subsequently, a 4% ammonia water (40 mL) was added. After the solution was stirred for 2 hours, a water layer was removed. Furthermore, ion exchange water (about 40 mL) was added to the organic layer and stirred for one hour, and then, the water layer was removed. Thereafter, the organic layer was added to methanol (70 ml) and stirred for 0.5 hours. The resultant precipitate was filtrated and dried under reduced pressure to obtain the polymer compound P-1 (0.050 g).

The number average molecular weight Mn and weight average molecular weight of Mw in terms of polystyrene were 2.1×10$^4$ and 3.5×10$^4$, respectively.

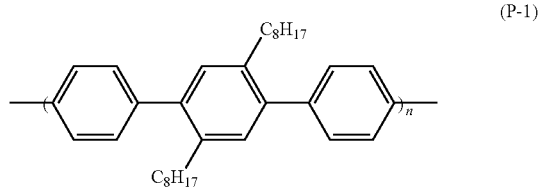

(P-1)

The electron conjugated chain coefficient $Z_e$ of the polymer compound (P-1) was 0.17. The lowest triplet excitation energy T (1/n=0), which is an extrapolation value at n=∞, and the absolute value $E_{LUMO}$ (1/n=0) of the lowest unoccupied molecular orbital energy were 3.3 eV and 1.5 eV, respectively.

Calculation was performed in the manner described in the detailed description of the invention. More specifically, the minimum repeat unit (M-3a) below of the polymer compound (P-1) is simplified as (M-3b) and structural optimization was performed in accordance with the HF method. At this time, as a basis function, 6–31G* was used. Thereafter, the lowest unoccupied molecular orbital energy and the lowest triplet excitation energy were obtained by a time-dependent density functional method of the B3P86 level using the same basis. The chemical structure is properly simplified. This is confirmed by the method of JP-A-2005-126686 based on the fact that dependency of the length of an alkyl side chain upon the lowest triplet excitation energy and the lowest unoccupied molecular orbital energy is low.

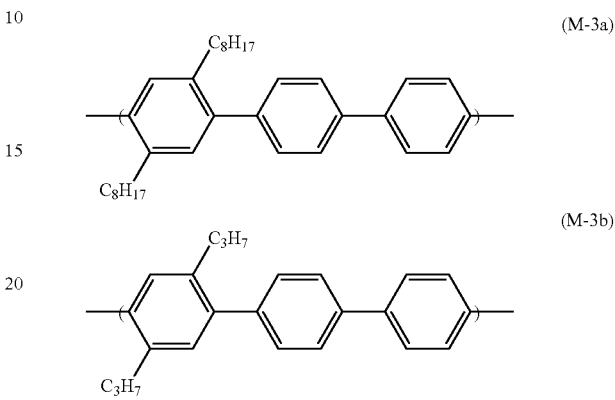

Example 2

A 0.8 wt % toluene solution of a mixture containing the aforementioned polymer compound (P-1) and the phosphorescent compound (T-1) (2 wt %) below was prepared. To a quartz substrate, the toluene solution was applied by spin coating at a rotation speed of 1500 rpm to form a film and then an element was formed.

A light spectrum was measured by injecting light of 400 nm. As a result, emission of blue light having a peak at about 480 nm from the phosphorescent compound (T-1) was observed.

Example 3

Synthesis of Polymer Compound (P-2)

The compound (M-1) (0.934 g) and the compound (M-4) (1.061 g) were dissolved under an inert atmosphere in dehydrated toluene (22 mL) previously bubbled with argon. Subsequently, the temperature of a reaction mass was increased to 45° C. To the reaction mass, palladium acetate (1.0 mg) and a phosphorus ligand (8 mg) were added and stirred for 5 minutes and then a base (7.6 ml) was added. The reaction mass was heated at 114° C. for 24 hours. Subsequently, bromo benzene (0.345 g) was added to the reaction mass, stirred at 114° C. for one hour and cooled to 65° C. To this, phenyl borate (0.268 g) was added and stirred again at 114° C. for one hour. The reaction mixture was cooled and poured in methanol (889 mL) to obtain the polymer compound (P-2).

The number average molecular weight Mn and weight average molecular weight Mw in terms of polystyrene were 2.5×10$^4$ and 7.0×10$^4$, respectively.

The polymer compound (P-2) was produced in accordance with the method described JP-A-2005-506439.

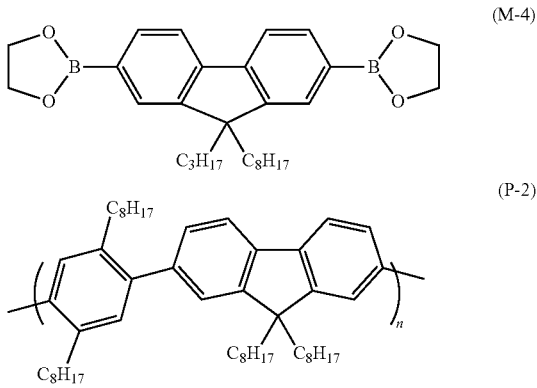

(M-4)

(P-2)

The conjugated chain coefficient Z of the polymer compound (P-2) was 0.07. The electron conjugated chain coefficient $Z_e$ thereof was 1.34. The lowest triplet excitation energy T (1/n=0), which is an extrapolation value at n=∞, and the absolute value $E_{LUMO}$ (1/n=0) of the lowest unoccupied molecular orbital energy were 3.1 eV and 1.5 eV, respectively. Note that the minimum unit constituting the polymer compound (P-2) and the minimum repeat unit to be subjected to calculation were simplified as shown in M-5.

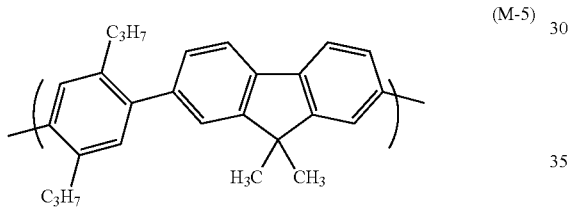

(M-5)

Example 4

A 1.2 wt % toluene solution of a mixture containing the aforementioned polymer compound (P-2) and the phosphorescent compound (T-2) (5 wt %) below was prepared. To a glass substrate on which an ITO film of 150 nm thick was attached by sputtering, a solution of poly(ethylenedioxythiophene)/polystyrene sulfonate (BaytronP manufactured by Bayer) was applied in accordance with spin coating to form a film of 50 nm in thickness. The film was dried on a hot plate at 200° C. for 10 minutes. On the film obtained, a film was formed by use of the toluene solution prepared above by spin coating at a rotation speed of 700 rpm. The thickness of the film was about 90 nm. This is further dried under reduced pressure at 80° C. for one hour. Thereafter, LiF of about 4 nm serving as a cathode buffer layer and calcium of about 5 nm serving as a cathode were deposited and subsequently aluminum of about 80 nm was deposited to manufacture an EL element. Note that, after degree of vacuum reached $1 \times 10^{-4}$ Pa or less, metal deposition was initiated.

When voltage was applied to the obtained element, green EL (electroluminescence) having a peak at 505 nm was obtained. A maximum luminescent efficiency of the element was 2.5 cd/A.

A 0.8 wt % toluene solution of a mixture containing the aforementioned polymer compound (P-2) and the phosphorescent compound (T-2) (2 wt %) was prepared. The toluene solution was applied to a quartz substrate by spin coating and photoluminescence quantum yield was determined. As a result, the quantum yield was 43.1%.

(Phosphorescence Compound)

The phosphorescence compound (T-1) was obtained from American Dye Source Inc. and the phosphorescence compound (T-2) was synthesized in accordance with the method described in Journal of American Chemical Society, Vol. 107, 1431-1432 (1985).

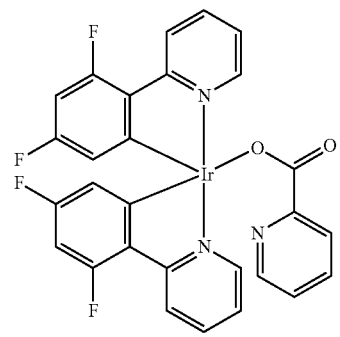

(T-1)

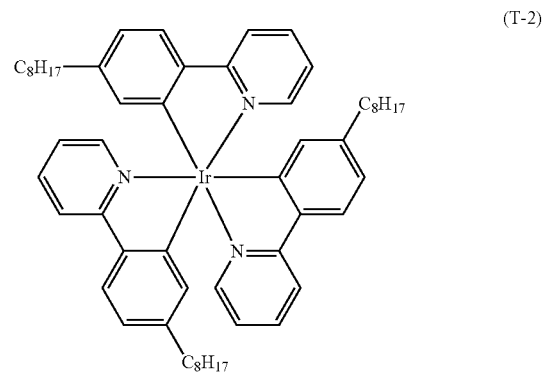

(T-2)

Comparative Example 1

A 0.8 wt % toluene solution of a mixture containing the polymer compound (R1) below and the aforementioned phosphorescent compound (T-2) (5 wt %) was prepared. An element was manufactured in the same manner as in Example 2. When voltage was applied to the obtained element, EL (electroluminescence) having a peak at 530 nm was obtained. A maximum luminescent efficiency of the element was as extremely low as 0.06 cd/A.

A 0.8 wt % toluene solution of a mixture containing the polymer compound (R1) below and the phosphorescent compound (T-2) (2 wt %) was prepared. The solution was applied onto a quartz substrate by spin coating and photoluminescence quantum yield was determined. The quantum yield was as low as 5.4%.

Note that the polymer compound (R1) was synthesized by the method described in U.S. Pat. No. 6,512,083.

Polymer compound (R1): homopolymer substantially formed of the following repeat units:

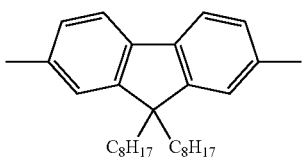

The conjugated chain coefficient Z of the aforementioned polymer compound (R1) was 0.61. The electron conjugated chain coefficient $Z_e$ thereof was 7.37. The lowest triplet excitation energy T (1/n=0), which is an extrapolation value at n=∞, and the absolute value $E_{LUMO}$ (1/n=0) of the lowest unoccupied molecular orbital energy were 2.6 eV and 2.1 eV, respectively. Note that the minimum unit constituting a polymer compound (R1) and the minimum repeat unit to be subjected to calculation were simplified as shown in M-6.

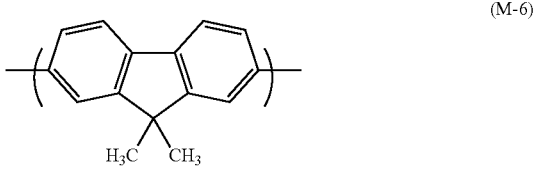
(M-6)

Example 5

Synthesis of 1,4-dihexyl-2,5-boronic acid pinacol ester

To a 300-ml four-neck flask, 8.08 g (20.0 mmol) of 1,4-dihexyl-2,5-dibromobenzene, 12.19 g (48.0 mmol) of bis(pinacolato)diboron and 11.78 g (120.0 mmol) of potassium acetate were supplied and argon replacement was performed. Ddehydrated1,4-dioxane (100 ml) was supplied and degassed with argon. Subsequently, 0.98 g (1.2 mmol) of [1,1'-bis(diphenylphosphino)ferrocene]dichloropalladium (II) was added and further degassed with argon. Reflux was performed with heating for 6 hours to obtain dark brown slurry. To the slurry, toluene and ion exchange water were added. The mixture was separated and the organic layer was washed with ion exchange water. Anhydrous sodium sulfate and activated carbon were added to the organic layer. The resultant solution was filtrated by a funnel precoated with cerite. The filtrate was concentrated to obtain dark brown crystals of 11.94 g. The crystals were recrystallized from n-hexane and washed with methanol. The resultant crystal was dried under reduced pressure to obtain white needle-like crystals of 4.23 g in a yield of 42.4%.

$^1$H-NMR (300 MHz/CDCl$_3$):
δ0.95 (t, 6H), 1.39-1.42 (bd, 36H), 1.62 (m, 4H) 2.88 (t, 4H), 7.59 (bd, 2H)
LC/MS(ESI posi KCl added): [M+K]$^+$573

Synthesis of Polymer Compound (P-3)

To a reaction tube, 0.4984 g (1.00 mmol) of 9,9-di(4(2-ethoxyethoxy)phenyl)-2,7-dibromofluorene, 0.6481 g (0.99 mmol) of 1,4-dihexyl-2,5-boronic acid pinacol ester and 0.147 g (0.36 mmol) of Aliquat336 (manufactured by Aldrich) were supplied and nitrogen replacement was performed. Toluene (8.5 ml) was supplied and the reaction solution was heated to raise the temperature. Then, 1.4 mg (0.002 mmol) of trans-dichloro-bis(triphenylphosphine)palladium (II) and 2M aqueous sodium carbonate solution (2.1 ml) were supplied. The progress of a reaction was monitored by GPC and 0.02 g (0.04 mmol) of 1,4-dihexyl-2,5-boronic acid pinacol ester was further added. The reaction solution was refluxed with heating for 10 hours. To this, 0.05 g (0.28 mmol) of 4-tert-butylphenyl borate and toluene (2 ml) were supplied and the reaction solution was refluxed with heating for 4 hours. After the water layer was removed, diethyldithiocarbamate trihydrate (0.6 g) in water (6 ml) was added to the organic layer and the resultant mixture was heated for 2 hours at 80° C. The water layer was removed and the resultant layer was washed with water, 3% acetic acid water, and water. The organic layer was concentrated and reprecipitated with methanol. The resultant copolymer was filtrated, dried under reduced pressure, dissolved in toluene, passed through an alumina/silica gel column, and washed with toluene. The organic layer was subjected to reprecipitation with methanol to obtain a copolymer. The obtained copolymer was filtrated, dried under reduced pressure, dissolved in toluene and reprecipitated with methanol to obtain a copolymer. Furthermore, the obtained copolymer was filtrated and dried under reduced pressure to obtain 0.32 g of the copolymer (polymer compound P-3). The average molecular weight Mn and weight average molecular weight Mw of the polymer compound P-3 in terms of polystyrene were 3.4×10$^4$ and 5.0×10$^4$ (moving phase: tetrahydrofuran).

Polymer compound (P-3)

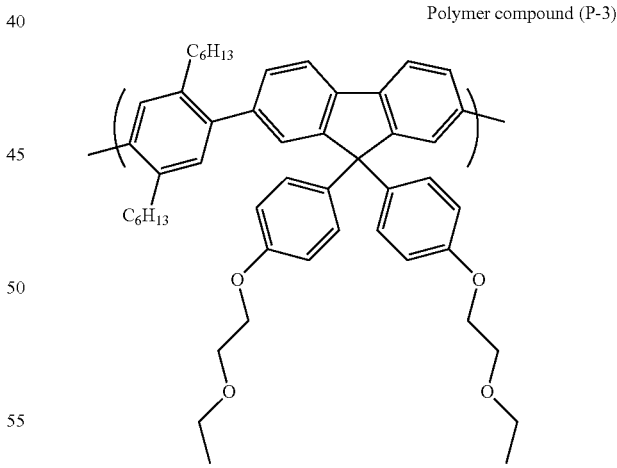

The conjugated chain coefficient Z of the polymer compound (P-3) was 0.10. The electron conjugated chain coefficient $Z_e$ thereof was 1.86. The lowest triplet excitation energy T (1/n=0), which is an extrapolation value at n=∞, and the absolute value $E_{LUMO}$ (1/n=0) of the lowest unoccupied molecular orbital energy were 2.99 eV and 1.6 eV, respectively. Note that the minimum unit constituting a polymer compound (P-3) and the minimum repeat unit to be subjected to calculation were simplified as shown in M-7.

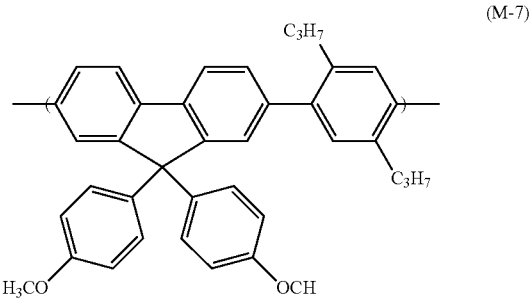

(M-7)

A 1.6 wt % toluene solution of a mixture containing the aforementioned polymer compound (P-3) and the phosphorescent compound (T-2) (5 wt %) was prepared. An element was manufactured in the same manner as in Example 2. The rotation number of spin coating of MI063 solution was 2100 rpm. When voltage was applied to the obtained element, green EL (electroluminescence) having a peak at 510 nm was obtained. A maximum luminescent efficiency of the element was 5.0 cd/A.

A 0.8 wt % toluene solution of a mixture containing the aforementioned polymer compound (P-3) and the phosphorescent compound (T-2) (2 wt %) was prepared. The toluene solution was applied to a quartz substrate by spin coating and photoluminescence quantum yield was determined. As a result, the quantum yield was 35.1%.

Example 6

Synthesis of Polymer Compound (P-4)

Under an inert atmosphere 1,4-dihexyl-2,5-dibromobenzene (0.400 g) and 1,4-dihexyl-2,5-boronic acid pinacol ester (0.498 g) were dissolved in dehydrated toluene (7.7 mL) previously bubbled with argon. Subsequently, the temperature of the reaction mass was increased to 80° C. To this, palladium acetate (0.45 mg) and a phosphorus ligand (7 mg) were added and refluxed with heating. To this, a base (2.1 mL) was added and refluxed with heating further for 7 hours. To the reaction mass, 4-t-butylphenyl borate (50 mg) was added and stirred for a further 3 hours. The reaction mixture was cooled and poured in methanol (155 ml) to obtain the polymer compound (P-4).

The number average molecular weight Mn and weight average molecular weight Mw in terms of polystyrene were $3.2 \times 10^3$ and $5.6 \times 10^3$, respectively.

The polymer compound (P-4) was produced in accordance with the method described JP-A-2005-506439.

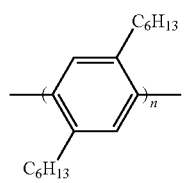

(P-4)

The conjugated chain coefficient Z of the polymer compound (P-4) was 0.16. The electron conjugated chain coefficient $Z_e$ thereof was 0.94. The lowest triplet excitation energy T (1/n=0), which is an extrapolation value at n=∞, and the absolute value $E_{LUMO}$ (1/n=0) of the lowest unoccupied molecular orbital energy were 3.61 eV and 0.84 eV, respectively. Note that the minimum unit constituting the polymer compound (P-4) and the minimum repeat unit to be subjected to calculation were simplified as shown in M-8.

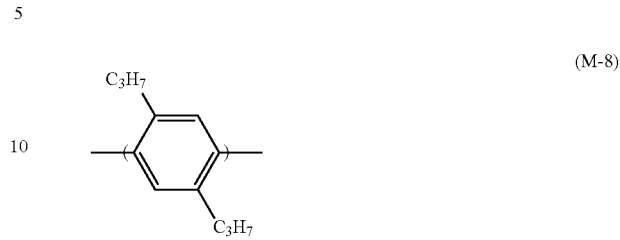

(M-8)

Example 7

A 0.2 wt % chloroform solution of a mixture containing the aforementioned polymer compound (P-4) and the phosphorescent compound (T-1) (2 wt %) was prepared.

The solution was applied onto a quartz substrate by spin coating.

Photoluminescence was measured using the substrate prepared above. Light emission having a maximum peak at 480 nm from the phosphorescent compound (T-1) was observed.

A 1 wt % chloroform solution of a mixture containing the aforementioned polymer compound (P-4) and the phosphorescent compound (T-2) (2 wt %) was prepared. The solution (0.1 ml) was put dropwise in the area of 1 cm² on the quartz substrate and dried in air to form a coating film. Using the substrate, photoluminescence was measured at an excitation wavelength of 463 nm. As a result, light emission having a maximum peak at 507 nm from the phosphorescent compound (T-2) was observed. The intensity of the light at 507 nm was about 16 fold as large as that of (p-2) synthesized in Example 3.

Example 8

Synthesis of Compound M-10

Synthesis of Compound M-10

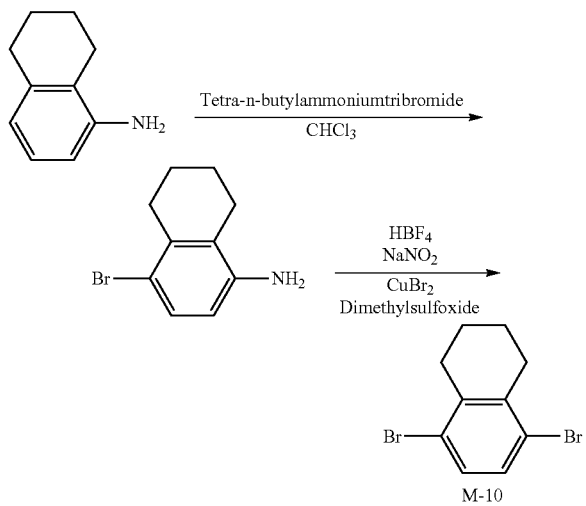

M-10

In a 300 ml four-neck flask, 2.94 g (20 mmol) of 1-amino-5,6,7,8-tetrahydronaphthalene was supplied and Ar replacement was performed. Under an Ar atmosphere, 20 ml of chloroform was supplied and cooled in a water bath. To this, a solution in which 9.84 g (20.4 mmol) of tetra n-butylammonium tribromide was dissolved in chloroform (50 ml) was added dropwise for about one hour under cool conditions. The reaction mass was changed into yellow-green slurry, which was maintained for one hour in an ice bath. Under cool conditions, a 5% aqueous $Na_2S_2O_5$ solution (50 ml) was added dropwise. The reaction mass was washed with a 10% aqueous NaOH solution and ion exchange water, and then separated. Dehydration with anhydrous salt cake, filtration and concentration were performed to obtain 7.43 g of light brown oil. The oil was diluted with toluene (50 ml), washed with ion exchange water and subjected to separation. Dehydration with anhydrous salt cake, filtration and concentration were performed to obtain 3.88 g of brown oil.

Purification was performed by silica gel column chromatography (Eluate: toluene) to obtain 1.18 g of brown oil. Production of 1-amino-4-bromo-5,6,7,8-tetrahydronaphthalene was confirmed based on $^1$H-NMR, LC/MS.

$^1$H-NMR (300 MHz/CDCl$_3$):

δ1.79 (s, 4H), 2.43 (s, 2H), 2.71 (s, 2H), 3.56 (s, 2H), 6.42 (d, H), 7.19 (d, H)

LC/MS (APPI posi): [M]$^+$226

In a 50 ml egg-plant flask, 0.90 g (4 mmol) of 1-amino-4-bromo-5,6,7,8-tetrahydronaphthalene, 3.86 g (20 mmol) of 48% aqueous HBF$_4$ solution were supplied. The flask was cooled in an ice bath. A solution having 0.32 g (4.6 mmol) of NaNO$_2$ dissolved in ion exchange water (1 ml) was cooled and added dropwise. After the flask was maintained at 0° C. for 30 minutes, the diazotized mass obtained was filtrated by suction and a diazotized compound was washed with a 5% aqueous HBF$_4$ solution and ice-cooled ion exchange water. To a 100 ml egg-plant flask, 1.12 g (5 mmol) of CuBr$_2$ and dimethylsulfoxide (10 ml) were supplied and vigorously stirred at room temperature. To this, the diazotized compound prepared above was added. The mixture was stirred at room temperature for 30 minutes. Ion exchange water was added and further stirred. The organic layer was separated and dehydrated with anhydrous salt cake, filtrated and concentrated to obtain 0.90 g of red brown oil. Purification was performed by a column (eluate: n-hexane) to obtain 0.66 g of transparent oil. Production of the compound M-10 was confirmed based on $^1$H-NMR, LC/MS.

$^1$H-NMR (300 MHz/CDCl$_3$):

δ1.80 (s, 4H), 2.74 (s, 4H), 7.26 (s, 2H)

GC/MS (EI-MS): [M]$^+$288

Synthesis of Polymer Compound (P-6)

Under an insert atmosphere, the compound M-10 (0.289 g) and compound M-4 (0.530 g) were dissolved in dehydrated toluene (8.5 mL) previously bubbled. Subsequently, the temperature of the reaction mass was increased to 80° C. To this, palladium acetate (0.67 mg) and a phosphorus ligand (7.4 mg) were added and refluxed with heating. After a base (2.7 ml) was added, the mixture was further refluxed with heating for 8 hours. To the reaction mass, phenyl borate (12 mg) was added and stirred for a further 3 hours. The reaction mixture was cooled and poured in methanol (155 ml) to obtain the polymer compound (P-6).

The number average molecular weight Mn and weight average molecular weight Mw in terms of polystyrene were $5.2 \times 10^4$ and $1.1 \times 10^5$, respectively.

A polymer compound (P-6) was produced in accordance with the method described JP-A-2005-506439.

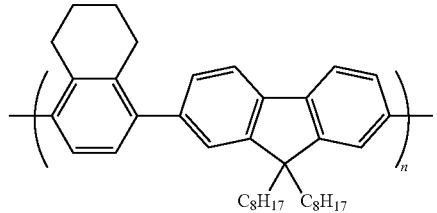

(P-6)

The conjugated chain coefficient Z of the polymer compound (P-6) was 0.07. The electron conjugated chain coefficient $Z_e$ thereof was 1.18. The lowest triplet excitation energy T (1/n=0), which is an extrapolation value at n=∞, and the absolute value $E_{LUMO}$ (1/n=0) of the lowest unoccupied molecular orbital energy were 3.06 eV and 1.56 eV, respectively. Note that the minimum unit constituting the polymer compound (P-6) and the minimum repeat unit to be subjected to calculation were simplified as shown in M-11.

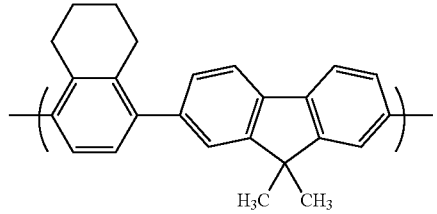

(M-11)

A 0.8 wt % toluene solution of a mixture containing the aforementioned polymer compound (P-6) and the phosphorescent compound (T-2) (2 wt %) was prepared.

The solution was applied onto a quartz substrate by spin coating and photoluminescence quantum yield was determined. As a result, intensive light having a maximum peak at 510 nm and emitting from the phosphorous compound T-2 was observed.

Example 9

The conjugated chain coefficient Z of the polymer compound (P-7) was 0.11. The electron conjugated chain coefficient $Z_e$ thereof was 0.68. The lowest triplet excitation energy $T_1$ (1/n=0), which is an extrapolation value at n=∞, and the absolute value $E_{LUMO}$ (1/n=0) of the lowest unoccupied molecular orbital energy were 3.64 eV and 0.62 eV, respectively. Note that as the minimum unit constituting the polymer compound (P-7) and the minimum repeat unit to be subjected to calculation, the following (M-12) was used.

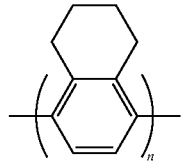

(P-7)

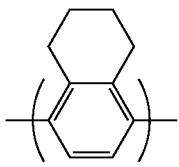
(M-12)

Example 10

The conjugated chain coefficient Z of the polymer compound (P-8) was 0.21. The electron conjugated chain coefficient $Z_e$ thereof was 1.28. The lowest triplet excitation energy $T_1$ (1/n=0), which is an extrapolation value at n=∞, and the absolute value $E_{LUMO}$ (1/n=0) of the lowest unoccupied molecular orbital energy were 3.54 eV and 1.04 eV, respectively. Note that, as the minimum unit constituting the polymer compound (P-8) and the minimum repeat unit to be subjected to calculation, the following (M-13) was used.

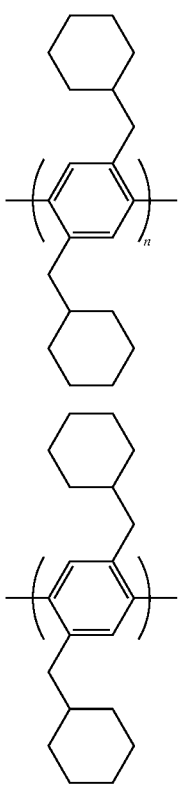
(P-8)

(M-13)

Synthesis Example 10

Synthesis of 2-(9-Bromo-7,7-dioctyl-7H-benzo[c]fluoren-5-yl)-4,4,5,5-tetramethyl-[1,3,2]dioxaborolane (M-14)

Under an inert atmosphere, 70.00 g (0.117 mol) of 5,9-Dibromo-7,7-dioctyl-7H-benzo[c]fluorene (M-15) was dissolved in dehydrated tetrahydrofuran (1170 mL) and dehydrated diethylether (1170 mL). To the obtained solution, 73 mL (1.6 mol/L) of a hexane solution of n-butyllithium was added dropwise at −70° C. for 30 minutes and further stirred at −70° C. for 50 minutes. Subsequently, 2-isopropoxy-4,4,5,5-tetramethyl-1,3,2-dioxaborolane was added dropwise at -78° C. for 10 minutes and further stirred at −78° C. for one hour. To this solution, an aqueous hydrochloric acid solution was added dropwise at room temperature for 15 minutes and the water layer was removed from the organic layer. To the organic layer, 1170 mL of distilled water was added and stirred. Thereafter, the water layer was removed and a 5% aqueous sodium hydrogen carbonate solution (1170 mL) was added and stirred. Thereafter, the water layer was removed. After distilled water (1170 mL) was added and stirred, the water layer was removed. Concentration and dehydration were performed to obtain an oily substance. The oily product was dissolved in tetrahydrofuran. To this, methanol was added to obtain a solid substance as a precipitate, which was filtrated and dried. Further, the solid substance was recrystallized from tetrahydrofuran and methanol, twice to obtain a desired compound 2-(9-Bromo-7,7-dioctyl-7H-benzo[c]fluoren-5-yl)-4,4,5,5-tetramethyl-[1,3,2]dioxaborolane (M-14) (57.7 g) in a yield of 76%.

$^1$H NMR (CDCl$_3$, 299.4 MHz, rt): d 0.50 (br, 4H), 0.80 (t, 6H, J=7.3 Hz), 0.90-1.28 (m, 24H), 1.45 (s, 12H), 1.93-2.19 (m, 4H), 7.50-7.67 (m, 4H), 8.03 (s, $^1$H), 8.19 (d, $^1$H, J=9.0 Hz), 8.67 (d, $^1$H, J=8.4 Hz), 8.92 (d, $^1$H, J=8.3 Hz).

LC-MS (APPI): m/z=644 (M$^{+\bullet}$)

(NMR)

Apparatus: INOVA300 nuclear magnetic resonance apparatus manufactured by made in Varian Inc.

Determination solvent: Deuterated chloroform

Sample concentration: About 1% by weight

Measurement temperature: 25° C.

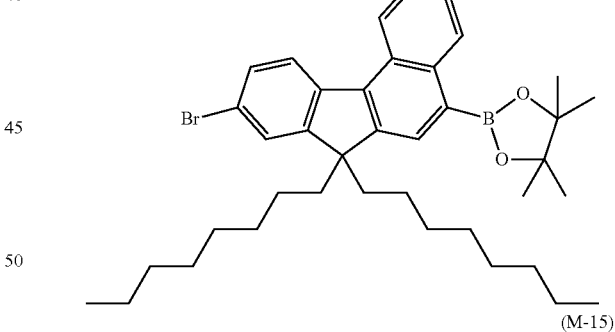
(M-14)

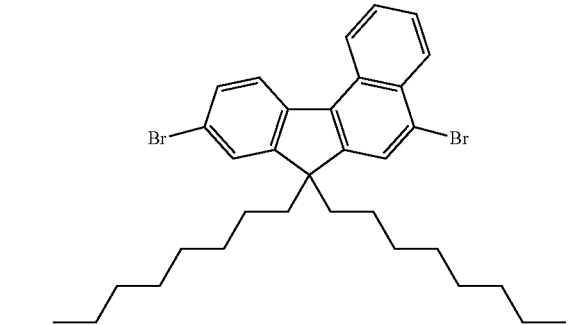
(M-15)

Synthesis Example 11

Synthesis of Polymer Compound (P-11)

Under an inert atmosphere, 1.08 g (1.67 mmol) of the compound (M-14) was dissolved in toluene (37 mL). To this, palladium acetate (1 mg), tris(o-methoxyphenyl)phosphine (7 mg) and a 30% aqueous bis(tetraethylammonium) carbonate solution (7.5 mL) were added and stirred at 115° C. for 20 hours. Subsequently, 0.16 g of 4-methylbromobenzene was added and stirred at 115° C. for 2 hours. To this, 0.16 g of 4-t-butylphenyl borate was added and stirred at 115° C. for 12 hours. Thereafter, to this, an aqueous sodium diethyldithiacarbamate solution was added and stirred at 65° C. for 8 hours. After cooling, the water layer was removed from the organic layer. The organic layer was washed with a 2N aqueous hydrochloric acid solution (37 ml) twice, a 10% aqueous sodium acetate solution (37 ml) twice and water (37 ml) six times. The obtained toluene solution was added dropwise to methanol (740 ml) and stirred. Thereafter, the obtained solid was collected by filtration and dried. The solid was dissolved in toluene. The resultant solution was added dropwise to methanol with stirring. The solid obtained as a precipitate was filtrated and dried. This operation was repeated twice to obtain 0.63 g of the polymer compound (P-9). The number average molecular weight and weight average molecular weight in terms of polystyrene were $8.4 \times 10^4$ and $2.8 \times 10^5$, respectively.

As the number average molecular weight and weight average molecular weight, use was made of the number average molecular weight and weight average molecular weight in terms of polystyrene obtained by GPC (LC-10Avp manufactured by Shimadzu Corporation). The polymer to be measured was dissolved in tetrahydrofuran such that the concentration was about 0.5 wt %. 50 μL of the solution was loaded to GPC. Tetrahydrofuran was used as the moving phase of GPC and supplied at a flow rate of 0.6 mL/min. As the column, two columns of TSK gel SuperHM-H (manufactured by Tosoh Corporation) and a single column of TSKgel SuperH2000 (manufactured by Tosoh Corporation) were connected in series. As a detector, a differential refractive index detector (RID-10A manufactured by Shimadzu Corporation) was used.

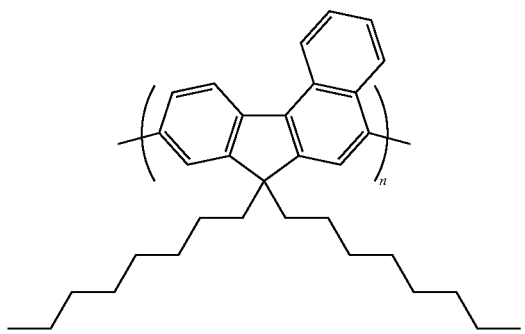

(P-9)

Comparative Example 2

The conjugated chain coefficient Z of the polymer compound (P-9) was 0.15. The electron conjugated chain coefficient $Z_e$ thereof was 2.46. The lowest triplet excitation energy $T_1$ (1/n=0), which is an extrapolation value at n=∞, and the absolute value $E_{LUMO}$ (1/n=0) of the lowest unoccupied molecular orbital energy were 2.42 eV and 2.13 eV, respectively. Note that, as the minimum unit constituting the polymer compound (P-9) and the minimum repeat unit to be subjected to calculation, the following (M-16) was used.

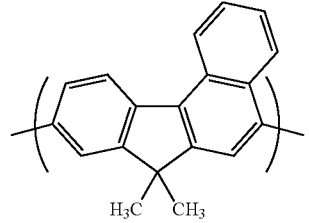

(M-16)

A 0.8 wt % toluene solution of a mixture containing the aforementioned polymer compound (P-9) and the phosphorescent compound (T-2) (2 wt %) was prepared.

The solution was applied onto a quartz substrate by spin coating and photoluminescence quantum yield was determined. As a result, the quantum yield was as low as 3.8%.

INDUSTRIAL APPLICABILITY

A luminescent composition according to the present invention can emit light having a green to blue wavelength. Therefore, when a luminescent material containing a conjugated polymer according to the present invention is applied to an opt-electric device such as an electroluminescent element, the characteristics of the resultant element is more improved.

The invention claimed is:

1. A luminescent composition comprising a polymer and at least one type of phosphorescent compound emitting light having a wavelength of from green to blue, wherein electron conjugated chain coefficient $Z_e$ of a major and minimum repeat unit of the polymer falls within the following range:

$$0 < Z_e \leq 2.00 \quad (1)$$

where the electron conjugated chain coefficient $Z_e$ is defined as the slope of a linear approximation line of the following function in accordance with the least-squares method:

$$T_m = T_m(1/n_e)$$

where $n_e$ is the number of conjugated electrons contained in a minimum repeat unit; and $T_m$ is the lowest triplet excitation energy of an m-multimer obtained by connecting the minimum repeat units where m alters from 1 to 3 by 1's, with the proviso that the number of conjugated electrons is limited to that of conjugated electrons present in the main chain of the minimum repeat unit; and when a plurality of major and minimum repeat units are present, the lowest $Z_e$ is used, and wherein the phosphorescent compound is a complex emitting light from the triplet excited state in which the central metal is a gold atom, a platinum atom, an iridium atom or a rhenium atom.

2. The composition according to claim 1, said composition being a luminescent composition consisting of a polymer and at least one type of phosphorescent compound, wherein the electron conjugated chain coefficient $Z_e$ of the major and minimum repeat units of the polymer fall within the range (1).

3. The composition according to claim 1, wherein, in the major and minimum repeat unit of the polymer, two or more single bonds capable of cleaving a main chain are not consecutively present on the main chain, in which the phrase "capable of cleaving a main chain" refers to the ability of cleaving the main chain when the single bond is broken.

4. The composition according to claim 1, wherein the lowest triplet excitation energy $T_1$ of the polymer is 2.7 eV or more, in which the lowest triplet excitation energy $T_1$ of the polymer is an extrapolated value when $n_e$ is $\infty$, from a linear approximation line of the following function in accordance with the least-squares method $$T_m = T_m(1/n_e)$$

where $T_m$ is the lowest triplet excitation energy of an m-multimer obtained by connecting the minimum repeat units where m alters from 1 to 3 by 1's.

5. The composition according to claim 1, wherein the electron conjugated chain coefficient $Z_e$ of the major and minimum repeat unit of the polymer satisfies the condition:

$$0 < Z_e \leq 2.00$$

and the lowest triplet excitation energy $T_1$ of the polymer is 2.8 eV or more.

6. The composition according to claim 1, wherein the electron conjugated chain coefficient $Z_e$ of the major and minimum repeat unit of the polymer satisfies the condition:

$$0 < Z_e \leq 2.00$$

and the lowest triplet excitation energy $T_1$ of the polymer is 2.9 eV or more.

7. The composition according to claim 1, wherein the electron conjugated chain coefficient $Z_e$ of the major and minimum repeat unit of the polymer satisfies the condition:

$$0 < Z_e \leq 2.00$$

and the lowest triplet excitation energy $T_1$ of the polymer is 3.0 eV or more.

8. The composition according to claim 1, wherein the lowest triplet excitation energy $T_1$ (eV) of the polymer satisfies the condition:

$$2.7 \leq T_1 \leq 5.0.$$

9. The composition constituted of a polymer and a phosphorescent compound according to claim 8, wherein the polymer has a segment composed of a single type of basic structural unit; the lowest triplet excitation energy $T_{M1}$ of the basic structural unit satisfies the condition:

$$3.6 \text{ eV} \leq T_{M1} \leq 5.5 \text{ eV; and}$$

the lowest triplet excitation energy $T_1$ of the segment and the conjugated chain coefficient Z (defined below) of the basic structural unit, respectively, satisfy the conditions:

$$2.7 \text{ eV} \leq T_1 \leq 5.0 \text{ eV and}$$

$$0.00 < Z \leq 0.50$$

where the conjugated chain coefficient Z of the basic structural unit is defined as the slope of a linear approximation line of the following function in accordance with a least-squares method $$T_m = T_m(1/m)$$

where $T_m$ is the lowest triplet excitation energy of an m-multimer where m is the number of basic structural units and alters from 1 to 3 by 1's.

10. The composition according to claim 9, wherein the number $n_e$ of conjugated electrons contained in the basic structural unit of the segment contained in a polymer constituting the composition satisfies the following condition:

$$n_e \leq 6.$$

11. The composition constituted of the polymer and a phosphorescent compound according to claim 8, wherein the polymer has a segment composed of a single type of basic structural unit; the lowest triplet excitation energy $T_{M1}$ of the basic structural unit satisfies the condition:

$$3.2 \text{ eV} \leq T_{M1} < 3.6 \text{ eV; and}$$

the lowest triplet excitation energy $T_1$ of the segment, the absolute value $E_{LUMO}$ of the lowest unoccupied molecular orbital energy and the conjugated chain coefficient Z of the basic structural unit, respectively, satisfy the conditions below:

$$2.7 \text{ eV} \leq T_{M1} \leq 5.0 \text{ eV,}$$

$$1.4 \text{ eV} < E_{LUMO} \leq 5.0 \text{ eV and}$$

$$0.00 < Z \leq 0.25.$$

12. The composition constituted of a polymer and a phosphorescent compound according to claim 8, wherein the polymer has a segment composed of a single type of basic structural unit; the lowest triplet excitation energy $T_{M1}$ of the basic structural unit satisfies the condition:

$$2.9 \text{ eV} \leq T_{M1} < 3.2 \text{ eV, and}$$

the lowest triplet excitation energy $T_1$ of the segment, the absolute value $E_{LUMO}$ of the lowest unoccupied molecular orbital energy and the conjugated chain coefficient Z of the basic structural unit, respectively, satisfy the conditions.

$$2.7 \text{ eV} \leq T_1 \leq 5.0 \text{ eV,}$$

$$1.4 \text{ eV} < E_{LUMO} \leq 5.0 \text{ eV and}$$

$$0.00 < Z \leq 0.13.$$

13. The composition constituted of a polymer and a phosphorescent compound according to claim 8, wherein the polymer has a segment composed of at least two types of basic structural units; the lowest triplet excitation energy $T_1$ of the segment and the absolute value $E_{LUMO}$ of the lowest unoccupied molecular orbital energy, respectively, satisfy the conditions:

$$2.7 \text{ eV} \leq T_1 \leq 5.0 \text{ eV and}$$

$$1.4 \text{ eV} < E_{LUMO} \leq 5.0 \text{ eV; and}$$

the conjugated chain coefficient Z (defined below) satisfies the condition:

$$0.00 < Z \leq 0.40$$

where the conjugated chain coefficient Z is defined as the slope of a linear approximation line of the following function in accordance with a least-squares method $$T_m = T_m(1/m)$$

where $T_m$ is the lowest triplet excitation energy of an m-multimer where m is the number of minimum units and alters from 1 to 3 by 1's, in which the minimum unit is assumed to have the same basic structural unit constitution ratio as that constituting the segment.

14. A luminescent material containing a luminescent polymer which contains a luminescent compound in the same molecule, as a partial structure, wherein a polymer having an electron conjugated chain coefficient $Z_e$ of the major and minimum repeat unit falling within the range according to claim 1 is further contained, or the electron conjugated chain coefficient $Z_e$ of the luminescent polymer falls within the range according to claim 1.

15. The composition according to claim 1, wherein the minimum repeat unit of a polymer contains any one of an aromatic ring, a heterocyclic ring having 5 or more members and containing a hetero atom, an aromatic amine and a structure represented by the following formula (1), wherein, on the aromatic ring and the heterocyclic ring, a substituent may be present, which is selected from the group consisting of an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group and a cyano group,

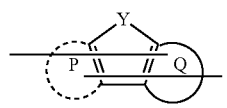
(1)

where P ring and Q ring each independently represent an aromatic ring; the P ring may or may not be present; two bonds are present respectively on the P ring and/or the Q ring when the P ring is present, and present on the 5-membered ring or 6-membered ring containing Y and/or the Q ring when the P ring is not present; furthermore, on the aromatic ring and/or the 5-membered ring or 6-membered ring containing Y, a substituent may be present, which is selected from the group consisting of an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group and a cyano group; Y represents —O—, —S—, —Se—, —B(R$_1$)—, —Si(R$_2$)(R$_3$)—, —P(R$_4$)—, —PR$_5$(=O)—, —C(R$_6$)(R$_7$)—, N(R$_8$)—, —C(R$_9$)(R$_{10}$)—C(R$_{11}$)(R$_{12}$)—, —O—C(R$_{13}$)(R$_{14}$)—, —S—C(R$_{15}$)(R$_{16}$)—, —N—C(R$_{17}$)(R$_{18}$)—, —Si(R$_{19}$)(R$_{20}$)—C(R$_{21}$)(R$_{22}$)—, —Si(R$_{23}$)(R$_{24}$)—Si(R$_{25}$)(R$_{26}$)—, —C(R$_{27}$)=C(R$_{28}$)—, —N=C(R$_{29}$)— or —Si(R$_{30}$)=C(R$_{31}$)—; and R$_1$ to R$_{31}$ each independently represent a hydrogen atom, an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a silyloxy group, a substituted silyloxy group, a monovalent heterocyclic group or a halogen atom.

16. The composition according to claim 15, wherein the minimum repeat unit of the polymer is constituted of an aromatic ring, a heterocyclic ring having 5 or more members and containing a hetero atom, an aromatic amine or a structure represented by the formula (1) mentioned above.

17. The composition according to claim 1, wherein the lowest triplet excitation energy ETT of a phosphorescent compound contained in the composition satisfies the condition:

$ETT > T_1 - 0.2$ (eV).

18. The composition according to claim 1, wherein the minimum repeat unit of the polymer contains any one of the structures represented by the following formulae (3-1) to (3-11):

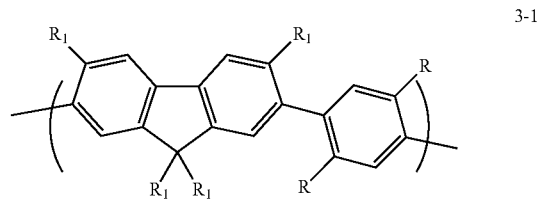
3-1

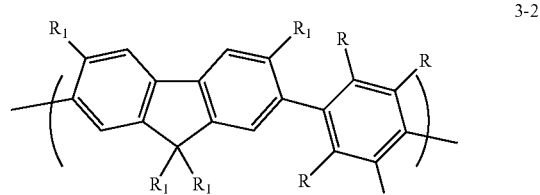
3-2

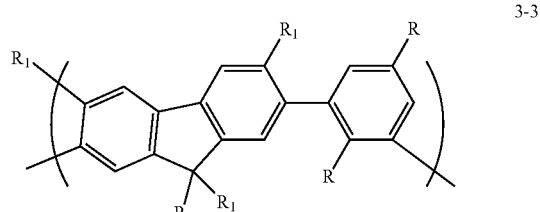
3-3

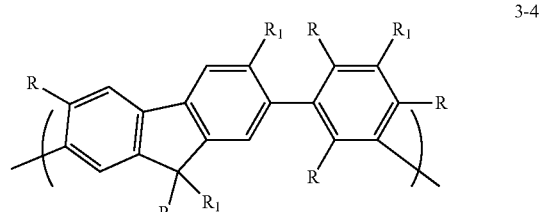
3-4

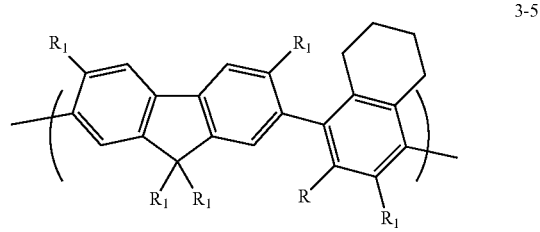
3-5

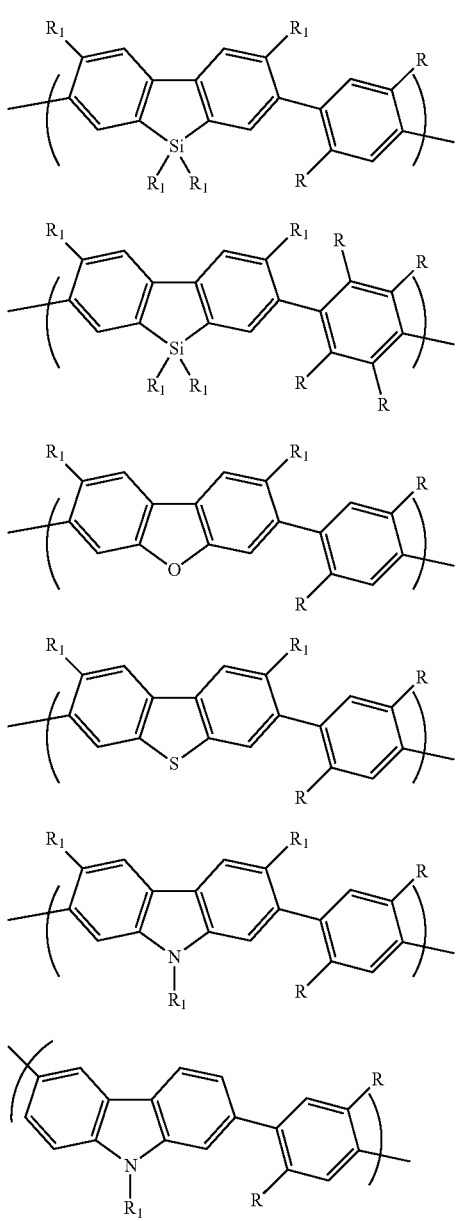

where R represents a halogen atom, an alkyl group, alkyloxy group, alkylthio group, aryl group, aryloxy group, arylthio group, arylalkyl group, arylalkyloxy group, arylalkylthio group, acyl group, acyloxy group, amide group, acid imide group, imine residue, substituted amino group, substituted silyl group, substituted silyloxy group, substituted silylthio group, substituted silylamino group, a monovalent heterocyclic group, heteroaryloxy group, heteroarylthio group, arylalkenyl group, arylethynyl group, substituted carboxyl group or cyano group;

$R_1$ represents a hydrogen atom, a halogen atom, an alkyl group, alkyloxy group, alkylthio group, aryl group, aryloxy group, arylthio group, arylalkyl group, arylalkyloxy group, arylalkylthio group, acyl group, acyloxy group, amide group, acid imide group, imine residue, substituted amino group, substituted silyl group, substituted silyloxy group, substituted silylthio group, substituted silylamino group, a monovalent heterocyclic group, heteroaryloxy group, heteroarylthio group, arylalkenyl group, arylethynyl group, substituted carboxyl group or cyano group;

a plurality of R and $R_1$ may be the same or different.

19. An ink composition characterized by containing the composition according to claim 1.

20. The ink composition according to claim 19, having a viscosity of 1 to 100 mPa·s at 25° C.

21. A luminous thin film characterized by containing the composition according to claim 1.

22. An organic semiconductor thin film characterized by containing the composition according to claim 1.

23. An opt-electric device characterized by containing the composition according to claim 1.

24. An opt-electric device characterized by containing a layer containing the composition according to claim 1 between the electrodes consisting of an anode and a cathode.

25. The opt-electric device according to claim 24, further comprising a charge transport layer or a charge blocking layer between the electrodes consisting of an anode and a cathode.

26. The opt-electric device according to claim 23, wherein the opt-electric device is a light-emitting device.

27. A planar light source characterized by using the light-emitting device according to claim 26.

28. A segment display device characterized by using the light-emitting device according to claim 26.

29. A dot matrix display device characterized by using the light-emitting device according to claim 26.

30. A liquid crystal display device characterized by using the light-emitting device according to claim 26 as backlight.

31. Illumination characterized by using the light-emitting device according to claim 26.

* * * * *